United States Patent
Blevins et al.

(10) Patent No.: US 9,046,881 B2
(45) Date of Patent: Jun. 2, 2015

(54) UPDATING AND UTILIZING DYNAMIC PROCESS SIMULATION IN AN OPERATING PROCESS ENVIRONMENT

(75) Inventors: Terrence L. Blevins, Round Rock, TX (US); Wilhelm K. Wojsznis, Austin, TX (US); Mark J. Nixon, Round Rock, TX (US)

(73) Assignee: FISHER-ROSEMOUNT SYSTEMS, INC., Round Rock, TX (US)

( * ) Notice: Subject to any disclaimer, the term of this patent is extended or adjusted under 35 U.S.C. 154(b) by 0 days.

(21) Appl. No.: 11/551,134

(22) Filed: Oct. 19, 2006

(65) Prior Publication Data

US 2007/0208549 A1    Sep. 6, 2007

Related U.S. Application Data

(63) Continuation of application No. 11/537,975, filed on Oct. 2, 2006, which is a continuation-in-part of application No. 11/014,307, filed on Dec. 16, 2004, which is a continuation of application No. 10/625,481, (Continued)

(51) Int. Cl.
*G06G 7/48* (2006.01)
*G05B 15/00* (2006.01)
(Continued)

(52) U.S. Cl.
CPC ..................................... *G05B 17/02* (2013.01)

(58) Field of Classification Search
CPC .... G05B 2219/23258; G06F 8/10; G06F 8/34
USPC ........................................ 703/6; 700/83, 117
See application file for complete search history.

(56) References Cited

U.S. PATENT DOCUMENTS

| RE30,280 E | 5/1980 | Berman et al. |
| 4,316,952 A | 2/1982 | Wendling |

(Continued)

FOREIGN PATENT DOCUMENTS

| DE | 197 40 972 C1 | 3/1999 |
| DE | 197 81 804 | 5/1999 |

(Continued)

OTHER PUBLICATIONS

Podesta and Veca, Virtual Instrumentation For The Management, Simulation And Control Of An In House Power Plant, Jun. 4-6, 1996, IEEE Instrumentation and Measurement Technology Conference, Brussels, Belgium, pp. 1104-1106.*

(Continued)

*Primary Examiner* — David Silver
*Assistant Examiner* — Juan Ochoa
(74) *Attorney, Agent, or Firm* — Marshall, Gerstein & Borun LLP

(57) ABSTRACT

A simulation system that includes interconnected simulation blocks which use process models to perform simulation activities for a process plant is integrated into a process control environment for the process plant in a manner that makes the simulation system easy to use and easily updated for on-line process simulation. The disclosed simulation system enables future predicted values as well as the current predicted values of process parameters produced by the simulation system to be made available for performance evaluation as well as to guide plant operations. Additionally, the simulation system is connected to the operating process plant to receive various on-line process plant measurements, and uses these measurements to automatically update the process models used in the simulation system, to thereby keep the simulation system coordinated with the actual operating conditions of the process plant.

38 Claims, 11 Drawing Sheets

Related U.S. Application Data filed on Jul. 21, 2003, now Pat. No. 7,110,835, which is a continuation-in-part of application No. 10/278,469, filed on Oct. 22, 2002, now Pat. No. 7,146,231.

(51) Int. Cl.
*G05B 11/01* (2006.01)
*G05B 17/02* (2006.01)

(56) References Cited

U.S. PATENT DOCUMENTS

| | | | |
|---|---|---|---|
| 4,506,324 A | 3/1985 | Healy | |
| 4,512,747 A | 4/1985 | Hitchens et al. | |
| 4,546,649 A | 10/1985 | Kantor | |
| 4,613,952 A * | 9/1986 | McClanahan | 703/6 |
| 4,628,435 A | 12/1986 | Tashiro et al. | |
| 4,663,704 A | 5/1987 | Jones et al. | |
| 4,736,320 A | 4/1988 | Bristol | |
| 4,885,717 A | 12/1989 | Beck et al. | |
| 4,972,328 A | 11/1990 | Wu et al. | |
| 4,977,529 A | 12/1990 | Gregg et al. | |
| 5,014,208 A | 5/1991 | Wolfson | |
| 5,021,947 A | 6/1991 | Campbell et al. | |
| 5,041,964 A | 8/1991 | Cole et al. | |
| 5,051,898 A | 9/1991 | Wright et al. | |
| 5,079,731 A | 1/1992 | Miller et al. | |
| 5,092,449 A | 3/1992 | Bolin et al. | |
| 5,097,412 A | 3/1992 | Orimo et al. | |
| 5,119,468 A | 6/1992 | Owens | |
| 5,159,685 A | 10/1992 | Kung | |
| 5,168,441 A | 12/1992 | Onarheim et al. | |
| 5,218,709 A | 6/1993 | Fijany et al. | |
| 5,241,296 A | 8/1993 | Naka et al. | |
| 5,268,834 A | 12/1993 | Sanner et al. | |
| 5,321,829 A | 6/1994 | Zifferer | |
| 5,347,446 A | 9/1994 | Iino et al. | |
| 5,347,466 A | 9/1994 | Nichols et al. | |
| 5,361,198 A | 11/1994 | Harmon et al. | |
| 5,428,555 A | 6/1995 | Starkey et al. | |
| 5,485,600 A | 1/1996 | Joseph et al. | |
| 5,485,620 A | 1/1996 | Sadre et al. | |
| 5,509,116 A | 4/1996 | Hiraga et al. | |
| 5,530,643 A | 6/1996 | Hodorowski | |
| 5,546,301 A | 8/1996 | Agrawal et al. | |
| 5,555,385 A | 9/1996 | Osisek | |
| 5,576,946 A | 11/1996 | Bender et al. | |
| 5,594,858 A | 1/1997 | Blevins | |
| 5,603,018 A | 2/1997 | Terada et al. | |
| 5,611,059 A | 3/1997 | Benton et al. | |
| 5,631,825 A | 5/1997 | van Weele et al. | |
| 5,732,192 A | 3/1998 | Malin et al. | |
| 5,752,008 A | 5/1998 | Bowling | |
| 5,768,119 A | 6/1998 | Havekost et al. | |
| 5,796,602 A | 8/1998 | Wellan et al. | |
| 5,801,942 A | 9/1998 | Nixon et al. | |
| 5,806,053 A | 9/1998 | Tresp et al. | |
| 5,812,394 A | 9/1998 | Lewis et al. | |
| 5,818,736 A | 10/1998 | Leibold | |
| 5,821,934 A | 10/1998 | Kodosky et al. | |
| 5,826,060 A | 10/1998 | Santoline et al. | |
| 5,828,851 A | 10/1998 | Nicon et al. | |
| 5,838,561 A * | 11/1998 | Owen | 700/32 |
| 5,838,563 A | 11/1998 | Dove et al. | |
| 5,862,052 A | 1/1999 | Nixon et al. | |
| 5,889,530 A | 3/1999 | Findlay | |
| 5,892,939 A | 4/1999 | Call et al. | |
| 5,898,860 A | 4/1999 | Leibold | |
| 5,903,455 A | 5/1999 | Sharpe, Jr. et al. | |
| 5,909,916 A | 6/1999 | Foster et al. | |
| 5,940,294 A | 8/1999 | Dove | |
| 5,950,006 A | 9/1999 | Crater et al. | |
| 5,960,214 A | 9/1999 | Sharpe, Jr. et al. | |
| 5,970,430 A | 10/1999 | Burns et al. | |
| 5,980,078 A | 11/1999 | Krivoshein et al. | |
| 5,983,016 A | 11/1999 | Brodsky et al. | |
| 5,995,753 A | 11/1999 | Walker | |
| 5,995,916 A | 11/1999 | Nixon et al. | |
| 6,003,037 A | 12/1999 | Kassabgi et al. | |
| 6,023,644 A | 2/2000 | Kinsman | |
| 6,032,208 A | 2/2000 | Nixon et al. | |
| 6,041,171 A | 3/2000 | Blaisdell et al. | |
| 6,069,629 A | 5/2000 | Paterson et al. | |
| 6,078,320 A | 6/2000 | Dove et al. | |
| 6,094,600 A | 7/2000 | Sharpe, Jr. et al. | |
| 6,098,116 A | 8/2000 | Nixon et al. | |
| 6,138,174 A | 10/2000 | Keeley | |
| 6,146,143 A | 11/2000 | Huston et al. | |
| 6,157,864 A | 12/2000 | Schwenke et al. | |
| 6,161,051 A | 12/2000 | Hafemann et al. | |
| 6,167,316 A | 12/2000 | McLaughlin et al. | |
| 6,173,438 B1 * | 1/2001 | Kodosky et al. | 717/109 |
| 6,178,393 B1 | 1/2001 | Irvin | |
| 6,195,591 B1 | 2/2001 | Nixon et al. | |
| 6,201,996 B1 | 3/2001 | Crater et al. | |
| 6,298,454 B1 | 10/2001 | Schleiss et al. | |
| 6,366,272 B1 | 4/2002 | Rosenberg et al. | |
| 6,385,496 B1 | 5/2002 | Irwin et al. | |
| 6,415,418 B1 | 7/2002 | Gloudeman et al. | |
| 6,442,512 B1 * | 8/2002 | Sengupta et al. | 703/6 |
| 6,442,515 B1 | 8/2002 | Varma et al. | |
| 6,445,963 B1 | 9/2002 | Blevins et al. | |
| 6,449,624 B1 | 9/2002 | Hammack et al. | |
| 6,477,435 B1 | 11/2002 | Ryan et al. | |
| 6,505,519 B2 | 1/2003 | Henry et al. | |
| 6,510,351 B1 | 1/2003 | Blevins et al. | |
| 6,515,683 B1 | 2/2003 | Wright | |
| 6,522,934 B1 | 2/2003 | Irwin et al. | |
| 6,546,297 B1 | 4/2003 | Gaston et al. | |
| 6,577,908 B1 | 6/2003 | Wojsznis et al. | |
| 6,587,108 B1 | 7/2003 | Guerlain et al. | |
| 6,615,090 B1 | 9/2003 | Blevins et al. | |
| 6,618,630 B1 | 9/2003 | Jundt et al. | |
| 6,618,745 B2 | 9/2003 | Christensen et al. | |
| 6,633,782 B1 | 10/2003 | Schleiss et al. | |
| 6,647,315 B1 | 11/2003 | Sherriff et al. | |
| 6,684,385 B1 | 1/2004 | Bailey et al. | |
| 6,687,698 B1 | 2/2004 | Nixon et al. | |
| 6,704,737 B1 | 3/2004 | Nixon et al. | |
| 6,711,629 B1 | 3/2004 | Christensen et al. | |
| 6,754,885 B1 | 6/2004 | Dardinski et al. | |
| 6,795,798 B2 | 9/2004 | Eryurek et al. | |
| 6,804,636 B2 | 10/2004 | Senta et al. | |
| 6,981,424 B2 | 1/2006 | Henry et al. | |
| 7,050,083 B2 | 5/2006 | Yoo et al. | |
| 7,050,863 B2 | 5/2006 | Mehta et al. | |
| 7,065,476 B2 | 6/2006 | Dessureault et al. | |
| 7,089,530 B1 | 8/2006 | Dardinski et al. | |
| 7,096,465 B1 | 8/2006 | Dardinski et al. | |
| 7,110,835 B2 | 9/2006 | Blevins et al. | |
| 7,113,834 B2 | 9/2006 | Wojsznis et al. | |
| 7,146,231 B2 | 12/2006 | Schleiss et al. | |
| 7,219,306 B2 * | 5/2007 | Kodosky et al. | 715/763 |
| 7,317,959 B2 | 1/2008 | Pfander et al. | |
| 7,502,656 B2 | 3/2009 | Thibault et al. | |
| 7,555,471 B2 | 6/2009 | Hogue et al. | |
| 7,593,780 B2 | 9/2009 | Mann et al. | |
| 7,647,126 B2 | 1/2010 | Blevins et al. | |
| 7,743,362 B2 * | 6/2010 | Peck et al. | 717/109 |
| 7,836,426 B2 * | 11/2010 | Peck et al. | 717/109 |
| 7,865,349 B2 * | 1/2011 | Kodosky et al. | 703/17 |
| 7,881,816 B2 * | 2/2011 | Mathiesen et al. | 700/47 |
| 2001/0039462 A1 | 11/2001 | Mendez et al. | 700/45 |
| 2002/0010571 A1 | 1/2002 | Daniel et al. | |
| 2002/0111783 A1 * | 8/2002 | Kodosky et al. | 703/13 |
| 2003/0188830 A1 | 10/2003 | Narendrnath et al. | |
| 2003/0200062 A1 | 10/2003 | Dessureault et al. | |
| 2004/0032433 A1 * | 2/2004 | Kodosky et al. | 345/810 |
| 2004/0078182 A1 | 4/2004 | Nixon et al. | |
| 2004/0249483 A1 | 12/2004 | Wojsznis et al. | |
| 2005/0062677 A1 | 3/2005 | Nixon et al. | |
| 2005/0096872 A1 | 5/2005 | Blevins et al. | |
| 2005/0158701 A1 * | 7/2005 | West | 435/3 |
| 2005/0164684 A1 | 7/2005 | Chen et al. | |
| 2005/0187717 A1 * | 8/2005 | Paxson et al. | 702/19 |

(56) References Cited

U.S. PATENT DOCUMENTS

| | | | |
|---|---|---|---|
| 2005/0197786 A1 | 9/2005 | Kataria et al. | |
| 2005/0257195 A1* | 11/2005 | Morrow et al. | 717/109 |
| 2006/0073013 A1* | 4/2006 | Emigholz et al. | 416/35 |
| 2006/0106477 A1* | 5/2006 | Miyashita | 700/103 |
| 2006/0259163 A1* | 11/2006 | Hsiung et al. | 700/30 |
| 2007/0059838 A1* | 3/2007 | Morrison et al. | 436/55 |
| 2007/0078529 A1 | 4/2007 | Thiele et al. | |
| 2007/0129917 A1 | 6/2007 | Blevins et al. | |
| 2007/0156264 A1 | 7/2007 | Schleiss et al. | |
| 2008/0288089 A1 | 11/2008 | Pettus et al. | |
| 2009/0210814 A1 | 8/2009 | Agrusa et al. | |
| 2009/0222752 A1 | 9/2009 | Wall et al. | |
| 2009/0287321 A1 | 11/2009 | Lucas et al. | |

FOREIGN PATENT DOCUMENTS

| | | |
|---|---|---|
| DE | 10011661 B4 | 9/2011 |
| EP | 0 813 129 | 5/1998 |
| EP | 1 204 033 | 5/2002 |
| EP | 1 284 446 | 2/2003 |
| GB | 2 328 523 | 2/1999 |
| GB | 2 348 020 | 9/2000 |
| GB | 2 371 884 | 8/2002 |
| GB | 2 446 343 A | 8/2008 |
| JP | 1-298389 | 12/1979 |
| JP | 60-075909 A | 4/1985 |
| JP | 1-120593 | 5/1989 |
| JP | 2-310602 | 12/1990 |
| JP | 3-257509 | 11/1991 |
| JP | 5-54277 | 3/1993 |
| JP | 6-26093 | 2/1994 |
| JP | 7-036538 | 2/1995 |
| JP | 7-248941 | 9/1995 |
| JP | 8-314760 | 11/1996 |
| JP | 9-134213 | 5/1997 |
| JP | 9-330013 | 12/1997 |
| JP | 11-007315 | 1/1999 |
| JP | 2000-047860 | 2/2000 |
| JP | 2000-050531 | 2/2000 |
| JP | 2000-148226 A | 5/2000 |
| JP | 2000-242323 A | 9/2000 |
| JP | 2000-243323 A | 9/2000 |
| JP | 2000-266213 A | 9/2000 |
| JP | 2000-292584 A | 10/2000 |
| JP | 2000-311004 | 11/2000 |
| JP | 2000-346299 A | 12/2000 |
| JP | 2001-273006 A | 10/2001 |
| JP | 2002-140114 | 5/2002 |
| JP | 2002-189503 A | 7/2002 |
| JP | 2002-215221 | 7/2002 |
| JP | 2002-242323 A | 8/2002 |
| JP | 2002-258936 | 9/2002 |
| JP | 2002-303564 | 10/2002 |
| JP | 2004-199656 A | 7/2004 |
| JP | 2003-34629 A | 9/2004 |
| JP | 9-288512 | 11/2007 |
| WO | WO-97/38362 | 10/1997 |
| WO | WO-97/45778 | 12/1997 |
| WO | WO-2007/067645 | 6/2007 |

OTHER PUBLICATIONS

IEEE 100 The Authoritative Dictionary of IEEE Standards Terms, 2000, Seventh Edition, p. 1054.*
SCADA, Wikipedia, printed Aug. 11, 2014, pp. 1.*
National Instruments, "What Is Data Acquisition", printed Aug. 11, 2014, pp. 1-2.*
"Powerful Solutions for Digital Plants", Mimic Simulation v2.6, Mynah Technologies 2003, pp. 1-15.
Bailey, "Introducing Bailey Evolution 90™ . . . The Sound Investment Strategy for Process Automation", 1993.
Bailey, "Wide-Range, Fully Compatible Family of Process Automation and Management Systems", 1993.
Computer Products, "Unbundling the DCS", approximately 1992.
Elsag Bailey, "Elsag Bailey Automation", approximately 1993.
Fisher-Rosemount, "Managing the Process Better", Dec. 1993.
Fisher-Rosemount, "Managing the Process Better", Sep. 1993.
Honeywell, "Process Manager Specification and Technical Data", Sep. 1991.
Honeywell, "TDC 3000 Overview", approximately 1992.
Honeywell, "TDC 3000 Process Manager", approximately 1992.
Honeywell, "UDC 6000 Process Controller", Aug. 1992.
Leeds and Northrup, "Make Your Automation Plan a Reality: MAX 1000", approximately 1990.
Notice of Reason for Rejection, issued in corresponding Japanese Application No. 2003-358631 dated Jan. 16, 2007.
Reliance Electric Company, "Multitasking Capability Simplifies Process Control Design", approximately late 1980s, by Angelo J. Notte.
Toshiba, "Toshiba Integrated Control Systems", Nov. 1990.
Nahavandi et al., "A Virtual Manufacturing Environment with an Element of Reality," *Advanced Factory Automation*, Conf. Pub. 398: 624-629 (1994).
Japanese Office Action dated Sep. 4, 2007 in Japanese related patent application No. 2003-358631 (3 pages).
Search Report for Application No. GB0719214.9, dated Feb. 12, 2008.
Notice of Rejection for Japanese Application No. 2003-362187, dated Nov. 2, 2009.
Magin, "Digitale Prozessleittechnik," 1st Edition, Vogel Publishing, pp. 145-153 (1987).
German Office Action for Application No. 10348563.5-55.
Podesta et al., "Virtual Instrumentation for the Management, Simulation and Control of an In House Power Plant," IEEE Instrumentation and Measurement Technology Conference, pp. 1104-1106 (1996).
Questioning for Japanese Patent Application No. 2003-362187 issued Feb. 14, 2012.
Japanese Office Action for 2010-108486 dated Mar. 6, 2012.
Second Office Action for Chinese Application No. 200710164172.2, dated Jun. 5, 2012.
Notice of Reasons for Rejection for Japanese Application No. 2007-258407 mailed May 22, 2012.
Notice of Reasons for Rejection for Japanese Application No. 2011-274307, dated Feb. 5, 2013.
German Office Action for Application No. 103 48 564.3, issued on Jul. 16, 2012.
Notice of Reasons for Rejection for Japanese Application No. 2011-27092, dated Nov. 13, 2012.
Notice of Reasons for Rejection for Japanese Application No. 2010-108486, dated Jan. 7, 2013.
Yumoto, "Evolving Dynamic Simulator: Visual Modeler," *Separation Technology*, 6(6):367-372 (1999).
Chinese Office Action for Application No. 2003101027291, dated Jun. 21, 2007.
Chinese Office Action for Application No. 2003101027291, dated Nov. 19, 2010.
Chinese Rejection Decision for Application No. 2003101027291, dated Feb. 5, 2010.
Combined Search and Examination Report for Application No. GB 0514158.5, dated Dec. 23, 2005.
Combined Search and Examination Report for Application No. GB 0514161.9, dated Jan. 10, 2006.
Combined Search and Examination Report for Application No. GB 0514164.3, dated Dec. 23, 2005.
Examination Report for Application No. GB0719214.9, dated Mar. 4, 2010.
Examination Report for Application No. GB0719214.9, dated Aug. 10, 2010.
Examination Report for Application No. GB0719214.9, dated Sep. 9, 2009.
Invensys Process Systems News, Invensys Introduces Enhanced Foxboro Engineering and Operations for the I/A Series Automation System, (2002): Retreived from the Internet on May 28, 2010: URL:http://www.automation.com/smc/print.php?stripImages=no.
Notice of Rejection for Japanese Application No. 2000-134873, dated Feb. 3, 2004.

(56) References Cited

OTHER PUBLICATIONS

Notice of Rejection for Japanese Application No. 2003-362187, dated Sep. 6, 2010.
Ohmura, "Dynamic Simulator Visual Modeler," pp. 20-27 (1998).
PSS 21S-2B8 B4, FoxView Software, pp. 1-12 (2005).
Search Report for Application No. GB 0010850.6, dated Sep. 5, 2000.
Search Report for Application No. GB 0324470.4, dated Mar. 25, 2004.
Search Resort for Application No. GB 0324633.7, dated Mar. 30, 2004.
Notice of Reasons for Rejection for Japanese Application No. 2012-183410, dated Jul. 23, 2013.
Notice of Reasons for Rejection for Japanese Application No. 2012-195268, dated Aug. 13, 2013.
Decision of Rejection for Japanese Application No. 2012-183410 dated Apr. 22, 2014.

* cited by examiner

UPDATING AND UTILIZING DYNAMIC PROCESS SIMULATION IN AN OPERATING PROCESS ENVIRONMENT

RELATED APPLICATIONS

This is a continuation application of and claims priority to U.S. patent application Ser. No. 11/537,975, entitled "Updating and Utilizing Dynamic Process Simulation in an Operating Process Environment," which was filed on Oct. 2, 2006, which is a continuation-in-part application of and claims priority to U.S. patent application Ser. No. 11/014,307, entitled "Smart Process Objects Used in a Process Plant Modeling System," which was filed on Dec. 16, 2004, which is a continuation application of and claims priority to U.S. patent application Ser. No. 10/625,481, entitled "Integration of Graphic Display elements, Process Modules and Control Modules in Process Plants," which was filed on Jul. 21, 2003 and which issued as U.S. Pat. No. 7,110,835 on Sep. 19, 2006, and which, in turn, is a continuation-in-part application of U.S. patent application Ser. No. 10/278,469, entitled "Smart Process Modules and Objects in Process Plants," which was filed on Oct. 22, 2002, the entire disclosures of which are hereby incorporated by reference herein.

TECHNICAL FIELD

The present invention relates generally to process plants and, more particularly, to an intelligent control and simulation environment that enables simulation activities to be integrated with and updated from an on-line control system at a system level of the process plant control architecture.

DESCRIPTION OF THE RELATED ART

Distributed process control systems, like those used in chemical, petroleum or other processes, typically include one or more process controllers communicatively coupled to one or more field devices via analog, digital or combined analog/digital buses. The field devices, which may be, for example, valves, valve positioners, switches and transmitters (e.g., temperature, pressure, level and flow rate sensors), are located within the process environment and perform process functions such as opening or closing valves, measuring process parameters, etc. Smart field devices, such as field devices conforming to the well-known Fieldbus protocol may also perform control calculations, alarming functions, and other control functions commonly implemented within the controller. The process controllers, which are also typically located within the plant environment, receive signals indicative of process measurements made by the field devices and/or other information pertaining to the field devices and execute a controller application that runs, for example, different control modules which make process control decisions, generate control signals based on the received information and coordinate with the control modules or blocks being performed in the field devices, such as HART and Fieldbus field devices. The control modules in the controller send the control signals over the communication lines to the field devices to thereby control the operation of the process.

Information from the field devices and the controller is usually made available over a data highway to one or more other hardware devices, such as operator workstations, personal computers, data historians, report generators, centralized databases, etc., typically placed in control rooms or other locations away from the harsher plant environment. These hardware devices run applications that may, for example, enable an operator to perform functions with respect to the process, such as changing settings of the process control routine, modifying the operation of the control modules within the controller or the field devices, viewing the current state of the process, viewing alarms generated by field devices and controllers, simulating the operation of the process for the purpose of training personnel or testing the process control software, keeping and updating a configuration database, etc.

As an example, the DeltaV™ control system, sold by Emerson Process Management includes multiple applications stored within and executed by different devices located at diverse places within a process plant. A configuration application, which resides in one or more operator workstations, enables users to create or change process control modules and download these process control modules via a data highway to dedicated distributed controllers. Typically, these control modules are made up of communicatively interconnected function blocks, which are objects in an object oriented programming protocol, which perform functions within the control scheme based on inputs thereto and which provide outputs to other function blocks within the control scheme. The configuration application may also allow a designer to create or change operator interfaces which are used by a viewing application to display data to an operator and to enable the operator to change settings, such as set points, within the process control routine. Each dedicated controller and, in some cases, field device, stores and executes a controller application that runs the control modules assigned and downloaded thereto to implement actual, process control functionality. The viewing applications, which may be run on one or more operator workstations, receive data from the controller application via the data highway and display this data to process control system designers, operators, or users using the user interfaces, and may provide any of a number of different views, such as an operator's view, an engineer's view, a technician's view, etc. A data historian application is typically stored in and executed by a data historian device that collects and stores some or all of the data provided across the data highway while a configuration database application may run in a still further computer attached to the data highway to store the current process control routine configuration and data associated therewith. Alternatively, the configuration database may be located in the same workstation as the configuration application.

As noted above, operator display applications are typically implemented on a system wide basis in one or more of the workstations and provide preconfigured displays to the operator or maintenance persons regarding the operating state of the control system or the devices within the plant. Typically, these displays take the form of alarming displays that receive alarms generated by controllers or devices within the process plant, control displays indicating the operating state of the controllers and other devices within the process plant, maintenance displays indicating the operating state of the devices within the process plant, etc. These displays are generally preconfigured to display, in known manners, information or data received from the process control modules or the devices within the process plant. In some known systems, displays are created through the use of objects that have a graphic associated with a physical or logical element and that is communicatively tied to the physical or logical element to receive data about the physical or logical element. The object may change the graphic on the display screen based on the received data to illustrate, for example, that a tank is half full, to illustrate the flow measured by a flow sensor, etc. While the information needed for the displays is sent from the devices or configuration database within the process plant, that information is used only to provide a display to the user containing that information. As a result, all information and programming that is used to generate alarms, detect problems within the plant, etc. must be generated by and configured within the different devices associated with the plant, such as controllers and field devices during configuration of the process plant control system. Only then is this information sent to the operator display for display during process operation.

While error detection and other programming is useful for detecting conditions, errors, alarms, etc. associated with control loops running on the different controllers and problems within the individual devices, it is difficult to program the process control system to recognize system-level conditions or errors that must be detected by analyzing data from different, possible diversely located devices within the process plant. Still further, operator displays have typically not been used to indicate or present such system-level condition information to operators or maintenance personnel and, in any event, it is difficult to animate objects within operator displays with these alternate sources of information or data for the different elements within the display. This fact is particularly true with respect to the animation and modeling of streams of material, such as the flow of fluid in pipes, the movement of raw materials on conveyor belts, etc. which are typically indicated by a simple line connected between two devices on the display. Moreover, there is currently no organized manner of detecting certain conditions within a plant, such as flow conditions and mass balances, as materials move through a plant, much less an easily implementable system for performing these functions on a system-level basis.

Likewise, while using process simulation in an operating process environment is not new, it can be difficult to set up or create a simulation of the process plant or a portion of the process plant as simulation activities must typically be performed separately from the display and control activities performed in the on-line environment of the process plant. Still further, if a simulation of the plant is created, it is difficult, if not impossible, to integrate this simulation with the operator displays or with the control modules being implemented within the plant. For example, it is known to implement process simulation using HYSYS (a high fidelity simulation program) when designing a plant and to later use that same simulation to assist in performing plant operations. One of the benefits of using process simulation in conjunction with the operating plant is that the actual plant performance may be compared to the design performance. However, current technology only shows the current value of the process parameters calculated in the simulation. Also, even a simple process simulation may contain hundreds of configurable parameters that each impact the simulation results. As a result, the actual plant may not match the simulated plant, or may not match the simulated plant for very long after creation of the simulation, due to changes in the plant, degradation of plant equipment, etc. With current technology, such differences are generally resolved by an engineer manually adjusting the configurable parameters of the simulation. This method of correcting the simulation, however, is time consuming, relies heavily on operator know-how and is fraught with inaccuracies.

SUMMARY

A simulation system is integrated into a process control environment in a manner that makes the simulation system easy to use and in a manner that makes updating of the on-line process simulation automatic and practical. The disclosed simulation system enables future values as well as the current values of process parameters to be made available for performance evaluation as well as to guide plant operations. Also, the simulation system may be connected to various on-line process or plant measurements and may used these measurements to automatically update the process model(s) used in the simulation system, to thereby keep the simulation system coordinated with the actual operating state of the process plant.

The simulation system may be implemented with smart process objects which have both graphical and simulation elements that are used to depict and model the operation of a plant or a portion of the plant. Generally speaking, each smart process object, which represents a physical device or entity within the process plant (such as a valve, a tank, a pipe, etc.), includes a graphical element that may be used in a graphical display to depict that physical element and a modeling or simulation element, such as an algorithm, that models or simulates the behavior of that process element when operating in the plant. In particular, a smart process object may include a display element to be displayed to the operator, data storage for storing data pertaining to and received from an associated entity within a plant, inputs and outputs for communicating with other process objects, methods that may be executed on the stored and received data to detect plant or device conditions, such as leaks, errors and other conditions and a simulation algorithm that may be used to simulate operation of the process entity.

During configuration, multiple smart process objects may be connected together to create a simulation system that depicts and simulates the operation of the different portions of the process plant and to create a process module that models or simulates the behavior of the portion of the process plant. In that line, each process module (and each display associated with a process module) receives inputs and produces outputs corresponding to the fluid, gas, or other materials moving through the plant and models or simulates the behavior of the process elements in the process plant with respect to their effect on the materials moving through the plant. In this manner, the graphic display portion of the smart process object may be used to depict the operation of the element within the plant (and the role or effect of that element in the plant) and the simulation element of the smart process object may be used to simulate the effect of the actual physical element on the movement of the fluid or other material in the plant. Data from the actual plant (e.g., as measured within the plant) may also be communicated to and depicted within the graphic display created using smart process objects.

To perform more advanced and accurate simulation, smart connection objects may be useful in modeling connections between physical entities within the plant. Such connections may, for instance, specify a pipe connection, a duct connection, an electrical connection, or a conveyor connection. Accordingly, the connection may pertain to one of a number of different types of material flow through the connection. The smart connection object may store connection parameter data pertaining to the connection, such as information indicative of the connection type or connection status. Execution of the smart connection object as part of a simulation system helps to produce a model of the operation of the process plant by displaying a graphic representation of the connection and simulating the material flow through the connection.

Simulation is also provided via smart stream objects, which may be associated with streams of material (or material flow) within the plant. Such streams may represent fluids, solids or gases flowing or moving through the plant and each stream may include properties or parameters of the stream such as pressure, volume, density, flow rate, composition, etc.

which may change as the stream moves through the different elements of the process module. Because the streams flow through the inputs and outputs of the process control elements, the properties of the streams are generally effected by the process elements (valves, tanks, etc.) through which the streams flow and, as a result, the individual elements within the process module may include algorithms to simulate the effect of those process elements on the streams provided at the inputs thereof.

To effect the operation of the graphic displays or the process modules created from smart process objects, an operator workstation or other computer runs an execution engine that executes the created graphic displays or process modules. As part of this operation, the process modules may execute methods, called flow algorithms, that can be used to detect process conditions, especially on a system-level basis and to simulate the effect of process elements on the streams flowing through the plant. As a result, the process modules and graphic displays created from the smart process objects enable the implementation of condition and error detection routines at the operator display device, and may work together with or eliminate the need to provide this functionality down within the controller and field devices of the plant. The process modules also provide the operator or configuration engineer with another degree of programming flexibility within the process plant that can be used to provide better and more complete information to the operator while still being easy to use and implement. Still further, the graphic displays may be animated with information determined by or calculated by flow algorithms of the process flow modules to provide the operator with additional information.

DETAILED DESCRIPTION

Figure 1:
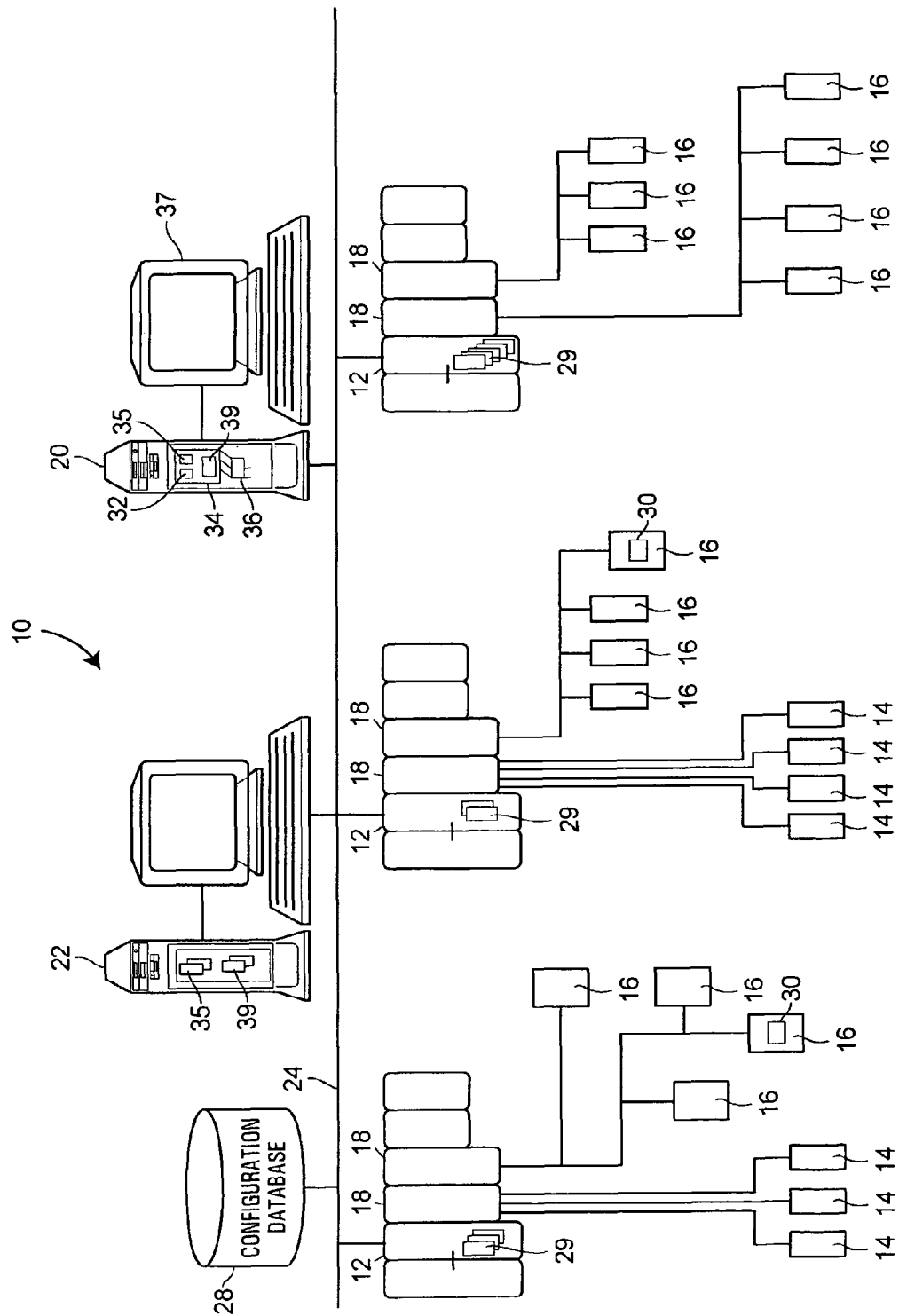
FIG. 1 is a block diagram of a distributed process control network located within a process plant including an operator workstation that implements a display routine which uses smart process objects to create process modules and graphic displays to simulate the operation of the process plant.

Referring now to FIG. 1, an example process plant 10 is illustrated in detail in which smart process objects used to form process graphic displays and process modules, both of which may be integrated with control modules to provide enhanced control and simulation within the plant environment. In particular, the process plant 10 uses a distributed process control system having one or more controllers 12, each connected to one or more field devices 14 and 16 via input/output (I/O) devices or cards 18 which may be, for example, Fieldbus interfaces, Profibus interfaces, HART interfaces, standard 4-20 ma interfaces, etc. The controllers 12 are also coupled to one or more host or operator workstations 20 and 22 via a data highway 24 which may be, for example, an Ethernet link. A database 28 may be connected to the data highway 24 and operates as a data historian that collects and stores parameter, status and other data associated with the controllers and field devices within the plant 10 and/or as a configuration database that stores the current configuration of the process control system within the plant 10 as downloaded to and stored within the controllers 12 and field devices 14 and 16. While the controllers 12, I/O cards 18 and field devices 14 and 16 are typically located down within and distributed throughout the sometimes harsh plant environment, the operator workstations 20 and 22 and the database 28 are usually located in control rooms or other less harsh environments easily assessable by controller or maintenance personnel.

As is known, each of the controllers 12, which may be by way of example, the DeltaV™ controller sold by Emerson Process Management, stores and executes a controller application that implements a control strategy using any number of different, independently executed, control modules or blocks 29. Each of the control modules 29 can be made up of what are commonly referred to as function blocks wherein each function block is a part or a subroutine of an overall control routine and operates in conjunction with other function blocks (via communications called links) to implement process control loops within the process plant 10. As is well known, function blocks, which may be objects in an object oriented programming protocol, typically perform one of an input function, such as that associated with a transmitter, a sensor or other process parameter measurement device, a control function, such as that associated with a control routine that performs PID, fuzzy logic, etc. control, or an output function that controls the operation of some device, such as a valve, to perform some physical function within the process plant 10. Of course hybrid and other types of complex function blocks exist such as model predictive controllers (MPCs), optimizers, etc. While the Fieldbus protocol and the DeltaV system protocol use control modules and function blocks designed and implemented in an object oriented programming protocol, the control modules could be designed using any desired control programming scheme including, for example, sequential function block, ladder logic, etc. and are not limited to being designed and implemented using the function block or any other particular programming technique.

In the plant 10 illustrated in FIG. 1, the field devices 14 and 16 connected to the controllers 12 may be standard 4-20 ma devices, may be smart field devices, such as HART, Profibus, or FOUNDATION™ Fieldbus field devices, which include a processor and a memory, or may be any other desired type of device. Some of these devices, such as Fieldbus field devices (labeled with reference number 16 in FIG. 1), may store and execute modules, or sub-modules, such as function blocks, associated with the control strategy implemented in the controllers 12. Function blocks 30, which are illustrated in FIG. 1 as being disposed in two different ones of the Fieldbus field devices 16, may be executed in conjunction with the execution of the control modules 29 within the controllers 12 to implement process control, as is well known. Of course, the field devices 14 and 16 may be any types of devices, such as sensors, valves, transmitters, positioners, etc. and the I/O devices 18 may be any types of I/O devices conforming to any desired communication or controller protocol such as HART, Fieldbus, Profibus, etc.

In the process plant 10 of FIG. 1, the workstation 20 includes a suite of operator interface applications and other data structures 32 which can be accessed by any authorized user (sometimes referred to herein as a configuration engineer and sometimes as an operator although other type of users may exist) to view and provide functionality with respect to devices, units, etc. connected within the process plant 10. The suite of operator interface applications 32 is stored in a memory 34 of the workstation 20 and each of the applications or entities within the suite of applications 32 is adapted to be executed on a processor 36 associated with the workstation 20. While the entire suite of applications 32 is illustrated as being stored in the workstation 20, some of these applications or other entities could be stored in and executed in other workstations or computer devices within or associated with the plant 10. Furthermore, the suite of applications can provide display outputs to a display screen 37 associated with the workstation 20 or any other desired display screen or display device, including hand-held devices, laptops, other workstations, printers, etc. Likewise, the applications within the suite of applications 32 may be broken up and executed on two or more computers or machines and may be configured to operate in conjunction with one another.

Generally speaking, the suite of applications 32 provides for or enables the creation and use of three different types of entities, the operation of which may be integrated together to provide for enhanced control, simulation, and display functions within the process plant 10. More particularly, the suite of applications 32 may be used to create and implement process graphic displays 35 (which generally provide an operator display pertaining to a portion of the process plant), process modules 39 (which generally provide a simulation of a portion of a process plant) and process control modules, such as the control modules 29, which generally provide or perform on-line control of the process. The process control modules 29 are generally well known in the art and may include any type of control module, such as function block control modules, etc. The process graphic display elements 35, which will be described in more detail below, are generally elements that are used by an operator, engineer or other displays to provide information to a user, such as an operator, about the operation, configuration or set-up of the process plant and the elements therein. The process modules 39 are generally closely tied to the process graphic display elements 35 and may be used to perform simulations of the operation of the process plant or of some of the different elements therein connected in the manner depicted in the process graphic displays 35. The process graphic displays 35 and process modules 39 are illustrated as being stored in and executed by the workstations 20 and 22, although the process graphic displays 35 and the process modules 39 could be downloaded to and executed in any other computer associated with the process control plant 10, including laptops, handheld devices, etc.

Figure 2:
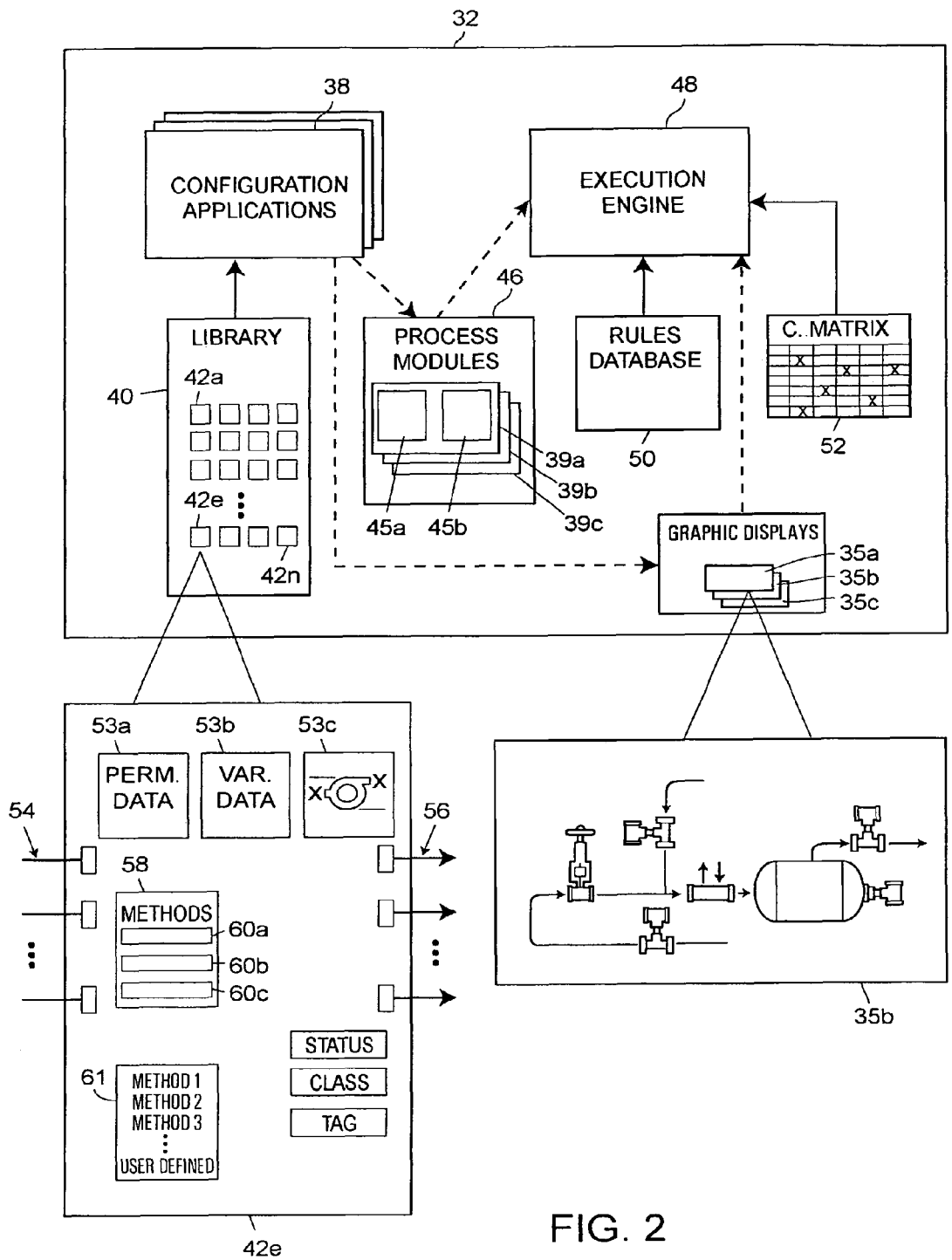
FIG. 2 is a logical block diagram of a set of applications and other entities, including smart process objects and process modules, stored in the operator workstation of FIG. 1, which may be used to implement enhanced functionality in a process plant.

FIG. 2 illustrates some of the applications and data structures or other entities within the suite of applications 32 of the workstation 20. In particular, the suite of applications 32 includes control module, process module, and graphic display configuration applications 38 which are used by a configuration engineer to create control modules, process modules (also called process flow modules) and the associated graphic displays. While the control module configuration application 38 may be any standard or known control module configuration application, the process module and graphic display configuration application may create process modules and graphic displays using one or more smart process objects, the nature of which will be described in more detail below. Still further, while the process module and process graphic configuration applications 38 are shown separately, one configuration application could create both of these types of elements.

A library 40 of smart process objects 42 includes example or template smart process objects 42 that may be accessed, copied and used by the configuration application 38 to create process modules 39 and graphic displays 35. As will be understood, the configuration application 38 may be used to create one or more process modules 39, each of which is made up of or created from one or more smart process objects 42 and may include one or more process flow or simulation algorithms 45, which are stored in a process module memory 46. Additionally, the configuration application 38 may be used to create one or more graphic displays 35, each of which is made up of or created from one or more smart process objects 42 and may include any number of display elements connected together. One of the graphic displays 35b is illustrated in FIG. 2 in expanded form and includes a depiction of a set of process elements, such as valves, tanks, sensors and flow transmitters, interconnected by connection elements which may be pipes, conduit, power cables, conveyors, etc.

An execution engine 48 operates or implements each of the graphic displays 35 and the process modules 39 during runtime to create one or more process displays for an operator as defined by the graphic displays 35 and to implement simulation functionality associated with the process modules 39. The execution engine 48 may use a rules database 50 defining the logic to be implemented on the process modules 39 as a whole and the smart process objects within those modules in particular. The execution engine 48 may also use a connection matrix 52 which defines the connections between the process elements within the plant 10 as well as within the process modules 39 to implement the functionality for the process modules 39.

FIG. 2 illustrates one of the smart process objects 42e in more detail. While the smart process object 42e is illustrated as being one of the template smart process objects, it will be understood that other smart process objects will generally include the same or similar elements, features, parameters, etc. as described with respect to the smart process object 42e and that the specifics or values of these elements, features and parameters may be changed or varied from smart process object to smart process object depending on the nature and use of that smart process object. Furthermore, while the smart process object 42e may be an object within an object oriented programming environment and thus include data stores, inputs and outputs and methods associated therewith, this smart process object may be created by and implemented within any other desired programming paradigm or protocol.

As will be understood, the smart process object 42e before being instantiated, is an object that is associated with a particular type of entity, such as a physical or a logical entity, within the process plant 10 of FIG. 1. However, after being copied and instantiated, the smart process object 42e may be tied to a particular entity within the process plant. In any event, the smart process object 42e includes a data store 53 that is used to store data received from or pertaining to the logical entity with which the smart process object 42e is associated. The data store 53 generally includes a data store 53a that stores general or permanent information about the entity to which the smart process object 42e pertains, like manufacturer, revision, name, type, etc. A data store 53b may store variable or changing data, such as parameter data, status data, input and output data, cost or other data about the entity to which the smart process object 42e pertains including data associated with the entity as it has existed in the past or as it now exists within the process plant 10. Of course, the smart process object 42e may be configured or programmed to receive this data (e.g., cost data) on a periodic or non-periodic basis, from the entity itself via any desired communication link, from the historian 28 via the Ethernet bus 24 or in any other desired manner. A data store 53c may store a graphical representation of the entity to which the smart process object 42e pertains and which is used for actual display to the operator via an operator interface, such as the screen 37 associated with the workstation 20 of FIG. 1. Of course, the graphical representation may include place holders (marked by underlines within the data store 53c) for information about the entity, such as information defined by the parameter or other variable data about the entity as stored in the data store 53b. This parameter data may be displayed in the graphical place holders when the graphical representation is presented to the operator on a display device 37 as part of one of the graphic displays 35. The graphical representation (and the smart process object 42e) may also include predefined connection points (marked by an "X" in the data store 53c) that enable an operator or configuration engineer to attach upstream or downstream components to the process element, as depicted by the graphical representation. Of course, these connection points also enable the smart process object 42e to be aware of the elements connected to that smart object as configured within a process module and may specify a type of connection element that must be used, such as a pipe, a duct, etc., a stream associated with that element, etc.

The smart process object 42e may also include one or more inputs 54 and outputs 56 to enable communication with other smart process objects within or outside of a process module in which the smart process object 42 is used. The connections of the inputs 54 and outputs 56 to other smart process objects may be configured by a configuration engineer during configuration of a process module by simply connecting other smart process objects to these inputs and outputs or by specifying particular communications that are to take place between smart process objects. Some of these inputs and outputs may be defined as being connected to the smart process objects connected at the predefined connection points for the smart process object as discussed above. These inputs 54 and outputs 56 may also be determined or defined by a set of rules within the rule database 50 and the connection matrix 52 defining the connections between different devices or entities within the plant 10. The inputs 54 and the outputs 56, which include data stores or buffers associated therewith will, generally speaking, be used to provide communications of data from other smart process objects to the smart process object 42e or to provide communications of data stored within or generated by the smart process object 42e to other smart process objects. These inputs and outputs may also be used to provide communications between the smart process object 42e and other objects within the process control system, such as control modules within the controllers 12, field devices 14, 16, etc.

As illustrated in FIG. 2, the smart process object 42e also includes a method storage 58 that is used to store zero, one or more methods 60 (illustrated as methods 60a, 60b and 60c in FIG. 2) which may be algorithms to be implemented by the smart process object 42e during execution of a process module in which the smart process object 42e is used. Generally, the methods 60 stored in the method storage 58 will use the data stored within the data storage portions 53a and 53b and data obtained from other smart process objects or even data from other sources, such as the configuration database or historian 28, via the inputs 54 and the outputs 56 to determine information about the process plant 10 or an entity within the plant 10. For example, the methods 60 may determine poor or bad operating conditions associated with the entity defined by the smart process object 42e, errors associated with that or other entities within the process plant 10, etc. The methods 60 may be preconfigured or provided based on the type or class of smart process object and will generally be executed each time the smart process object 42e is executed within the execution engine 48 during runtime. Some example methods 60 that may be provided within a smart process object, such as the smart process object 42e, include detecting leaks, dead band, dead time, movement, variability, condition monitoring, computing costs, or other conditions associated with the entity.

The methods 60 may also be provided to help simulate the operation of the process entity associated with the smart process object on the material flowing through that process entity. Thus, the methods 60 may be provided to calculate mass balances, energy balances, flows, temperatures, compositions, vapor states, and other system-level or stream level parameters associated with the material in the plant 10, to simulate operation of the element so as to calculate expected outputs based on provided inputs, etc. Of course, these are but a few of the methods that can be stored in and run by a smart process object 42e, and there are many other methods that may be used, with such methods generally being determined by the type of entity being represented, the manner in which that entity is connected in and used in a process plant as well as other factors. It is important to note that, while the smart process object 42e may store and execute methods that detect system-level conditions, errors, etc., these methods may also be used to determine other information about devices, logical elements, such as process control modules and loops, and other non-system-level entities. If desired, the methods 60 may be programmed or provided in any desired programming language, such as C, C++, C#, etc. or may be referenced to or may define applicable rules within the rule database 50 that should be run for the smart process object 42e during execution.

If desired, each smart process object may include a library of applicable algorithms or methods which may be used to define the simulation behavior of the smart process object when connected within a process module. Such a library is illustrated in a pull down menu 61 for the smart process object 42e of FIG. 2 and a similar menu may be associated with each other smart process object. The configuration engineer may define the simulation behavior of a smart process object when this smart process object is placed in a process module 39 by selecting one of the library of simulation algorithms (called method 1, method 2, etc.) via, for example, the pull down menu 61. In this manner, the configuration engineer may define different simulation behaviors for a smart process object depending on the type or nature of the process for which the smart process object is being used to model.

If desired, the configuration engineer may instead provide a proprietary or other user supplied algorithm to define the simulation behavior of the process element defined by the smart process block. Such a user defined algorithm (illustrated as the "user defined" entry in the pull down menu 61) may be provided to and stored in a smart process object when that smart process object is placed within or used within a process module 39. This functionality enables the simulation behavior to be customized by the user to thereby provide for better or more accurate simulation. If desired, and as will be described in more detail later, the smart process objects 42 or each process module 39 may include an operator actuatable switch (such as an electronic switch or a flag) that disables the use of the simulation algorithms within the smart process objects and that, instead, causes the behavior of the process module to be determined by a high fidelity simulation package or program, such as one provided by HYSYS. In this case, the smart process object or the process module obtains simulated parameters from the high fidelity simulation, as opposed to using the simulation algorithms within the smart process objects themselves.

During execution of a graphic display 35 or a process module 39 by the execution engine 48, the engine 48 implements the communications defined by the inputs 54 and outputs 56 to each of the smart process objects in the graphic display 35 or process module 39 and may implement the methods 60 for each of those objects to perform the functionality provided by the methods 60. As noted above, the functionality of the methods 60 may be located in programming within the smart process object or defined by a set of rules within the rule database 50 that the engine 48 executes, based on the type, class, identification, tag name, etc. of a smart process object, to implement the functionality defined by those rules.

It will be noted that an instance of the smart process object 42*e* has a tag or unique name within the context of the process module with which the smart process object 42*e* is associated and this tag or unique name may be used to provide communications to and from the smart process object 42*e* and may be referenced by the execution engine 48 during runtime. Process module tags should be unique within the control system configuration. This tagging convention enables elements within the process modules 39 to be referenced by elements within others of the process graphic displays 35, process modules 39 and even the control modules 29. Still further, the parameters of the smart process object 42*e* can be simple parameters, such as simple values, structured parameters or smart parameters that know the expected units and attributes associated therewith. Smart parameters can be interpreted and used by the process rules engine or execution engine 48 to assure all signals are being sent in the same units or are converted properly. Smart rules can also be used to turn on and turn off groups of alarms for the smart process objects (or process modules) to create a smart alarm strategy and/or interface for the operator. Still further, smart process object classes can be associated with equipment and module classes within the process control strategy of the plant 10 to provide a known linkage between a smart process object and the process variables it will need to interpret or access.

Smart process objects, when used in process graphic displays or process modules, may also include mode of operation, status, and alarm behavior so that these smart objects may be put in different modes during runtime, such as the off, start-up, and normal modes, may provide a status associated with the object based on its current operating state, and may provide alarms based on detected conditions, such as a parameter out of range, limited, high variability, etc. Smart process objects may also have a class/subclass hierarchy which enables them to be categorized in class libraries, to be collected together in a composite structure, etc. Still further, smart process objects may utilize information from other elements, such as control modules and other objects to enable the smart process object to recognize when its associated entity is busy or, for example, acquired by a batch control process within the plant 10.

Smart process objects may be associated with any desired process entity, such as physical devices like pumps, tanks, valves, etc., or logical entities such as process areas, measurements or actuators, control strategies, etc. In some cases, smart process objects may be associated with connectors, such a piping, conduit, wiring, conveyors, or any other device or entity that moves material, electricity, gas, etc. from one point to another point within the process. Smart process objects that are associated with connectors, sometimes referred to herein as smart links or connector elements, are also tagged (even though the actual device or connector itself may not be tagged or able to communicate within the process plant 10), and are generally used to represent material flow between other elements in the process.

Smart links or smart connector objects will typically include properties or parameters that define how different materials or phenomena (such as electricity) flow through the connection (e.g. steam, electricity, water, sewage, etc.) These parameters may indicate the type and nature of flow (such as the general speed, friction coefficients, type of flow like turbulent or non-turbulent, electromagnetic, etc.) through the connector and the possible direction or directions of flow through the connector. Smart links may include programming or methods that ensure that the units of the source and destination object to which the smart link connects, match and, if not, may perform a conversion. The methods of the smart link may also model the flow through the connector using a model or an algorithm to estimate the speed or nature of the flow through the actual connectors, length and size of the physical connections, transport delay, etc. The stored parameters for the smart process object (such as friction parameters) may be used in these methods. Thus, in essence, the smart links or connector elements enable smart process objects to be aware of the other upstream and downstream objects or entities. Of course, smart links may, for example, define the connections between other objects, the type of fluid, such as liquid, gas, electricity, etc. within the system, the upstream and downstream side of the entities, which other entities are upstream and downstream of the entity for this smart process object, the direction of material, fluid, electric flow, etc. in any desired or convenient manner. In one embodiment, the matrix 52 may be created prior to execution of process flow modules and may define for the smart links the interconnections between the different devices within the plant and, therefore, the interconnections between the different smart process objects. In fact, the execution engine 48 may use the matrix 52 to ascertain the upstream and downstream entities and thereby define the communications between the smart process objects and the methods associated with the smart process objects. Still further, one or more sets of rules may be provided to be used by the smart process objects to interact with each other and to obtain data from each other as needed for the methods within the smart process objects and to resolve the impact of smart objects associated with output connections.

If desired, the smart process object 42e may also include hot links, such as URLs, to key documentation which may be applicable to the type of object, or which may be specific to the instance (depending on the criticality and application) of the device to which the smart process object 42e pertains. The documentation may be vendor supplied as well as user-specific. Some examples of documentation include configuration, start-up and shut-down procedures, operational and maintenance documentation. If desired, an operator may click on the object as displayed in an operator display to bring up the instance specific (if any) and generic documentation for the object or associated device. Also, the operator may be able to add/delete/change documentation independently of the system software such as maintenance requests, records of operational problems, etc. Furthermore, these hot links may be user configurable or changeable to provide the ability to add knowledge links to objects in the an operator interface, to provide for quick navigation to appropriate information associated with the object and to provide the ability to add work instructions specific to the customer, to the specific object type or even to the specific instance of the object.

While the process modules and process graphics are described above as being created together by the interconnection of different smart process objects, they may be created separately. For example, a process graphic may be created using smart process objects and, when completed, a process module for that graphic may be generated based on graphic elements and their interconnections in the graphic display. Alternatively, the process module may be first created using smart process objects and, once created, a graphic display for that process module may be automatically generated by the configuration application 38 using the graphic display elements in the smart process objects used to create the process module. Still further, a process module and a graphic display may be created separately and the individual elements within these two entities may be tied together manually by referencing one another (e.g., using the tag properties of the elements within the graphic display and the process module). Through this mechanism, a smart process object may be referenced by multiple displays. In any event, once created, a process graphic display and an associated process module may be run independently or separately, although they will typically communicate parameters and information back and forth as desired or needed.

In order to be more comprehensive, certain possible features and examples of smart process objects that may be used in or to create process graphic displays and process modules will be described in more detail below. Thereafter, a manner in which process graphic displays and process modules, created using the described elements and features, may be integrated with control modules to provide advanced control and simulation capabilities will be described. It will be understood, of course, that the smart process object elements and features are not limited to the elements and features discussed herein and that other features and elements could be used in or to create one or both of process graphic displays and process modules, if so desired. Still further, it will be understood that, while the simulation procedures provided below to be used in one or more simulation systems are described in conjunction with simulation systems constructed using smart objects; the use of smart objects in these simulation systems is not necessary, and other types of programming techniques could be used to develop or implement these simulation systems instead.

Generally speaking, a set of predefined graphic elements may be provided in the configuration application to enable a user to construct operator or graphic displays that reflect the process plant. These graphic elements are designed to dynamically show on-line measurements and actuators that interface with the control system. In addition, unmeasured parameters that reflect process operation may be calculated using on-line process simulation provided in the process modules and may be shown as an integral part of the associated graphic displays.

Additionally, in an on-line or and off-line environment used for engineering or training simulation purposes, the process simulation provided by the process modules may be used in place of the process measurement values in the graphic elements and in the associated control modules. These values, which are calculated by the associated process modules, may be based on the actuator position or state as well as manual disturbance values illustrated in the process graphics. In this manner, the graphic displays and control modules may be used in both on-line or control situation and in both on-line and off-line simulation situations. Also, while the static portion of the graphic elements will, in many cases, appear similar to the three dimensional components included in known graphics libraries, further unique features or properties of these graphic elements, the information displayed with these elements, and their links to the control system I/O and process simulation modules is described below with respect to a number of possible types and examples of graphic elements.

Generally speaking the graphic elements and simulation algorithms in the process module associated with a smart process object fall into a one of a number of different types of process elements including stream elements, process connection elements, actuator elements, processing elements, measurement elements and estimated property elements. Stream elements generally define a stream of material in the process plant and may be exposed in the graphic display to show the composition, density, flow, temperature, pressure, weight, and/or any other parameters defining the stream of material. Stream elements may be defined at the input of the process module and provided to elements within the process module to thereby enable the flow of material through the process module to be modeled and depicted in the graphic display. Similarly, stream elements may be illustrated at the output or end of the process module to illustrate in the graphic display the material output of the portion of the process plant depicted by the graphic display. Stream elements also may be used to define how different graphic displays (and the associated process modules) are connected with one another. For example, the output stream in one process module may be the input stream in another process module and may supply the values used at the input stream of the other process module. Streams may contain the following four parts: name (e.g., pH stream), direction (e.g., flow input), measurement (e.g., flow, pressure, temperature), and composition (e.g., nitrogen, ammonia, etc.) However, streams could have other parts or parameters if so desired.

Process connection elements define the manner in which materials within the plant, such as solid materials, liquid and vapor, and gases are delivered or carried from one device to another. To clearly illustrate the material flow through the process, three different types of process connections including piping, ducts and conveyors may be used. Of course other connection elements, such as electrical cables to address power flow in electro-chemical processes, etc. may be used as well. Piping is generally used to illustrate (and simulate) liquid and high pressure vapor or gas flow within the plant.

Ducts are generally used to illustrate (and simulate) low pressure gas flow within the plant. Conveyors are generally used to illustrate (and simulate) the movement of solid material between processing units. As a result, each process connection element defines the type of connection, such as a pipe connection, a duct connection or a conveyor connection that is used to provide material at the input or output of a device.

If desired, the properties of the material that is being transferred by a connection are determined by the upstream input. This information plus a connection status variable defining if the connection is complete may be made available as properties of the connection element on the graphic display. A connection element may start at a processing element output, an actuator element output or a stream element output. In a similar manner, a connection element may terminate at a processing element input, an actuator element input or a stream input.

The properties of a connection element may be automatically displayed when the cursor is placed over the connection element in the graphic display. Also, the properties associated with a connection element may be exposed for permanent display by placing a measurement or estimated property element (defined below) on the connection element. If desired, a connection element may be created by holding the left mouse button down over an element output (such as a stream output, a processing element output or an actuator element output) and, while holding down a button on the mouse, positioning the cursor over an element input. For the connection to be established successfully, the input and the output types (pipe, duct, or conveyor) of the upstream and the downstream elements must match. The connection will automatically take on the type of the upstream element.

If desired, piping elements can be shown or depicted in the process graphic display as a pipe connection, duct elements (e.g., air or gas) can be shown as a duct and conveyor elements may be shown as conveyor belts. Piping, duct and conveyor element connections can be automatically routed between processing elements and arrows may be displayed outside the depiction of these elements to show the direction of the flow. If an upstream output is common to two connections, then a "T" element may be included in the pipe, duct or conveyor. Similarly, "T" elements may be used to combine multiple outputs. The color or other graphic property of a conveyor element may change to indicate its status, e.g., running/stopped, flowing/not flowing, plugged, etc. Generally speaking, the material flow along a conveyor is determined by the motor drive connected to the conveyor. Thus, a motor drive actuator (which is an actuator element described in more detail below) may be connected to the conveyor. Additionally, measurement elements (described below) can be connected to pipe, duct and conveyor elements to make it possible to expose measurements associated with the pipe, duct or conveyor elements, such as the speed of the conveyor or the flow of material in a pipe or duct, the properties of the material on or in the conveyor, pipe or duct, e.g. moisture or weight. Also, an exposed property element may be added to display properties of the material on or in the pipe, duct or conveyor that are not measured, for example, the composition of the material.

If desired, each of the piping, duct and conveyor connection elements may graphically and dynamically reflect a lost connection (e.g., by a color change), and that a selected property (pressure, temperature, length, etc.) is outside configured limits (e.g., by a color change). Furthermore, parameters calculated by the associated process module may be exposed in the graphic. For example, properties provided by the upstream connection, whether the connection status is bad or good, limits on one or more selected parameters of the connection element, etc. may be exposed in the graphic display to provide information to the operator about the connection element or the stream being transferred by the connection element.

Generally speaking, actuator elements are elements that perform some actuation function with respect to the stream and may be placed between different connection elements or between a processing element and a connection element. Examples of actuator elements include a regulating valve (with actuator), an on-off valve (with actuator), a pump (with motor), a force draft fan (with motor), an induced draft fan (with motor), an eductor (with on-off valve), a damper (with drive), a feeder (with variable speed motor) a conveyor motor drive (which may be attached to a conveyor element), etc.

The graphic depiction of the valve elements may dynamically reflect the implied valve position (by animation, for example), valve failure (by a color change, for example), the valve full open/closed position (by a color change, for example), and the AO, DO, DC, setpoint, PV, OUT, mode, etc. (by a numeric string or other indication, for example) of the associated control block controlling that valve. The simulation element associated with the valve elements (used in the process module) may have simulation algorithms that calculate parameters associated with the valve actuator, such as the discharge pressure, mass flow, liquid temperature, liquid composition, inlet pressure, and outlet pressure. These simulated or calculated parameters may be exposed in the process graphic, if so desired. However, the user or configuration engineer must usually configure the reference to an AO, DO or DC block in a control module associated with the valve as well as the valve type (e.g., linear, quick opening, equal percentage, valve sizing, etc.) and the stroke time from open to close. Of course, the simulation algorithms available to simulate the operation of the valve on the material flowing through the valve may be dependent upon the type of the valve and sizing information.

The graphic depiction of pump elements may dynamically reflect the motor status (using, for example, a color change), the associated DO or DC function block mode and setpoint (using, for example, strings), the motor speed (if variable speed drive is used), the AO setpoint, PV, OUT mode (if variable speed drive is used) and other desired parameters. Likewise, the process simulation (used in the process module) for this element may determine or calculate parameters such as the discharge pressure, liquid composition, liquid temperature, and mass flow, which parameters may be exposed in the graphic display. The user may need to define a pump curve based on the pump type. However, the user may configure the reference to the DO or DC block associated with the motor start/stop, the reference to the associated AO function block for variable speed drive (if used) and the pump curve (e.g., pressure versus flow) for the defining the operation of the pump.

The graphic depiction of a force draft or an induced fan actuator element may have a depiction that dynamically reflects the motor status, DO or DC function block mode and setpoint, motor speed (if variable speed drive is used), the AO setpoint, PV, OUT, DO or DC function block mode (if variable speed drive is used) and other desired parameters, any of which may be exposed in the graphic display. The process simulation element (used in a process module) for this element may determine or calculate parameters such as the discharge pressure, gas composition, gas temperature, and gas mass flow, which parameters may be exposed in the graphic display. The user may configure the reference to the associated DC block for motor start/stop, the reference to an AO block for variable speed drive (if used) and the fan curve (pressure versus flow) for defining the simulated operation of the fan.

In some cases a particular type of actuator may only be used with a specific type of connection, e.g., a pipe, a duct or a conveyor. The table below defines some example connection limitations for typical actuator elements.

|  | Pipe | Duct | Conveyor |
|---|---|---|---|
| Regulating valve | X | | |
| On-Off Valve | X | | |
| Pump | X | | |
| Eductor | X | | |
| Force Draft Fan | | X | |
| Induced Draft Fan | | X | |
| Damper Drive | | X | |
| Feeder | X | | X |
| Motor Drive | | | X |

Processing elements include plant equipment that processes the materials or streams in the plant in some manner. Generally speaking, all inputs and outputs to and from processing elements will be made through connection elements. Standard processing elements include tanks (vertical and horizontal), heaters, static mixers, reactors, mixers, air heaters and any other elements that perform some type of simple or standard processing activity. For standard processing elements, the user may specify the number of inputs and outputs to the element along with the physical equipment properties e.g. size, volume, etc. The simulation algorithm and static representation of these standard processing elements may be set so that they cannot be modified by the user but may be selectable as described above at configuration time. Of course, if desired, other, typically more complex plant equipment (such as distillation columns, evaporators, separators, boilers, etc.) may be implemented as custom processing elements. The static representation, number of inputs and outputs and the simulation algorithm of such custom processing elements may be modified to meet the user interface requirements. Once a custom processing element has been defined, it may be saved as a composite or template that may be reused or used as a starting point in the creation of other processing elements.

The tank standard processing element (either vertical or horizontal) may be configured based on the pipe connections to the tank and the tank element may dynamically reflect the level in the tank (using, e.g., dynamic animation), and the level at 100% or empty (using a color change, for example). The process module simulation for the tank may calculate and expose, via the graphic display, parameters such as the outlet temperature, the outlet composition, the liquid temperature and the simulated level of the tank. However, to tie the tank into the system, the user or configuration engineer may need to configure the number of input and output connections, the complete connections to the tank, the tank properties, such as size (e.g., diameter and height), etc.

The heater processing element may dynamically calculate and reflect, via the graphic display, the heat transfer coefficient (e.g., using a color change), the outlet product temperature, the inlet product temperature, the outlet pressure (assuming fixed drop), etc. A user or configuration engineer may need to configure the complete connections to the heater, the heater surface area and the heat transfer coefficient when clean.

Of course, other processing elements such as a static mixer, a reactor, a mixer, an air heater, a heat exchanger, etc. may have display and simulation capabilities that are tailored to these types of devices. Non-standard processing elements, such as distillation columns, evaporators, separators, boilers, etc. may be represented graphically using a custom processing element in which the simulation associated with the vessel may be user defined if not included in a standard selection. The processing in these elements may be described or defined as a step response model relating each input to each output of the vessel. Inputs may be gas and/or liquid streams. Optionally, the user may define the equations that describe the relationships between the inputs and outputs of the processing element and these equations may be stored in the process module using that element to perform simulation. If desired, some simple static graph representations may be provided to help the user quickly create the static graphics associated with a custom processing element. If these simple graphics are used, then the user may need to only specify the desired number of input and output connections and the type of connection supported (e.g., pipe, duct, or conveyor) supported by the custom processing element. In response, the graphic item will be displayed and can be immediately used in the creation of the operator graphic. If desired, the gains and any dynamics associated with each input and output of the process element may be specified if the user elects to specify the simulation algorithm as step responses. If the user selects a custom algorithm, then an expression editor may be provided for the user to define the simulation algorithm. Based on the method selected, the properties of the custom processing element outputs may be calculated differently. Furthermore, the user may reference one or more of the algorithms that they have defined in a separate software assembly.

Additionally, several pre-defined composites or templates may be provided for creating custom processing elements. These templates may include, for example, a boiler template having a custom algorithm that calculates the exit gas $O_2$, the exit gas CO, the steam generated, the boiler drum level and the boiler draft. Such a template may be based on a single fuel input. However, by modifying the template, it is possible to simulate boilers with multiple fuels. Other pre-defined templates may include a specialized vessel-cyclone separator template, which may be used with in conjunction with the spay dryer custom processing element, and which may include a step response model to model the operation of the separator. Likewise, a column template, a spray dryer, and an evaporator body may utilize a step response model to define the expected process response. In an evaporator, based on the energy input and the concentration of the input flow, the concentration of the outlet flow and vapor release can be calculated. Multiple evaporator elements may be connected together along with heat exchanger and eductor elements to create a multiple-effect evaporator. Similarly, a specialized vessel-stack custom template processing element may be used with the boiler processing element. In this case, the properties of the inlet may be carried through the stack with no modifications if so desired, or to reflect emissions reductions performed in the stack.

Other types of elements that can be used to create graphic displays and process modules include measurement elements and property elements. Measurement elements include transmitter elements, which may be used in the graphic display to access the measurement value associated with a physical transmitter, and switch elements. Generally, the transmitter element may dynamically reflect bad or uncertain status, the mode of the associated AI function block in the control module, the measurement value and units, etc. associated with an actual transmitter (sensor) or other data associated with the actual transmitter. In an off-line mode (or simulation mode)

the transmitter element may be used to access and display the simulation value provided by the process module rather than the value associated with the AI or PCI block or may be used to provide a measurement value to the associated AI block in the control module as a measurement to be used in the simulated control routine. The transmitter element can be added to a connection element or to a processing element and, when such a transmitter element is added to the display, the user will generally need to identify the associated AI, PCI or DI block in controller scheme that is providing the measurement. In the on-line mode, the value of the measurement may be shown next to this measurement element. In the off-line mode (or simulation mode) the simulated value of the measurement (as developed by the corresponding process module) may be automatically displayed. In on-line operation, the user can elect to switch control and display to the simulated value in the event of a measurement failure.

A switch element may dynamically reflect a bad or uncertain status, the mode of the associated DI (e.g., manual or OS), and the discrete value of a switch (on, off, etc.) When in an off-line simulation mode, the user may use the switch display element to access and change the switch parameters in the graphic display and control module by selecting a simulation value or a manual value and status and by manually entering the value and status of the switch. However, a user must generally configure the switch element by providing a reference to an associated DI block in the control scheme, a reference to the element property that triggers the switch and the limit and deadband associated with a change of state of the switch.

An estimated property element generally exposed an estimated property of the system as determined by the process module and may be added to a connection or processing element to display any property of that element. When this element is placed on a connection element or on a piece of equipment, the user can browse and select the properties that will be displayed. Thus, simulated properties that are not available through a physical measurement may be exposed through the use of the estimated properties element. Such an estimated property element may dynamically reflect a good/bad connection, the estimated property value(s), and a property that is outside of an associated limit or change. A user must generally configure the reference to property(s) to be displayed and the limits and color changes for the element if the property is outside of the limits.

As will be understood, by attaching transmitter elements and estimated property elements to processing elements, actuator elements and connection elements, the properties associated with the inputs and outputs of these process elements may be referenced during on-line operation or both on-line and off-line simulation. These properties may also be made visible in the graphic display.

Figure 3:
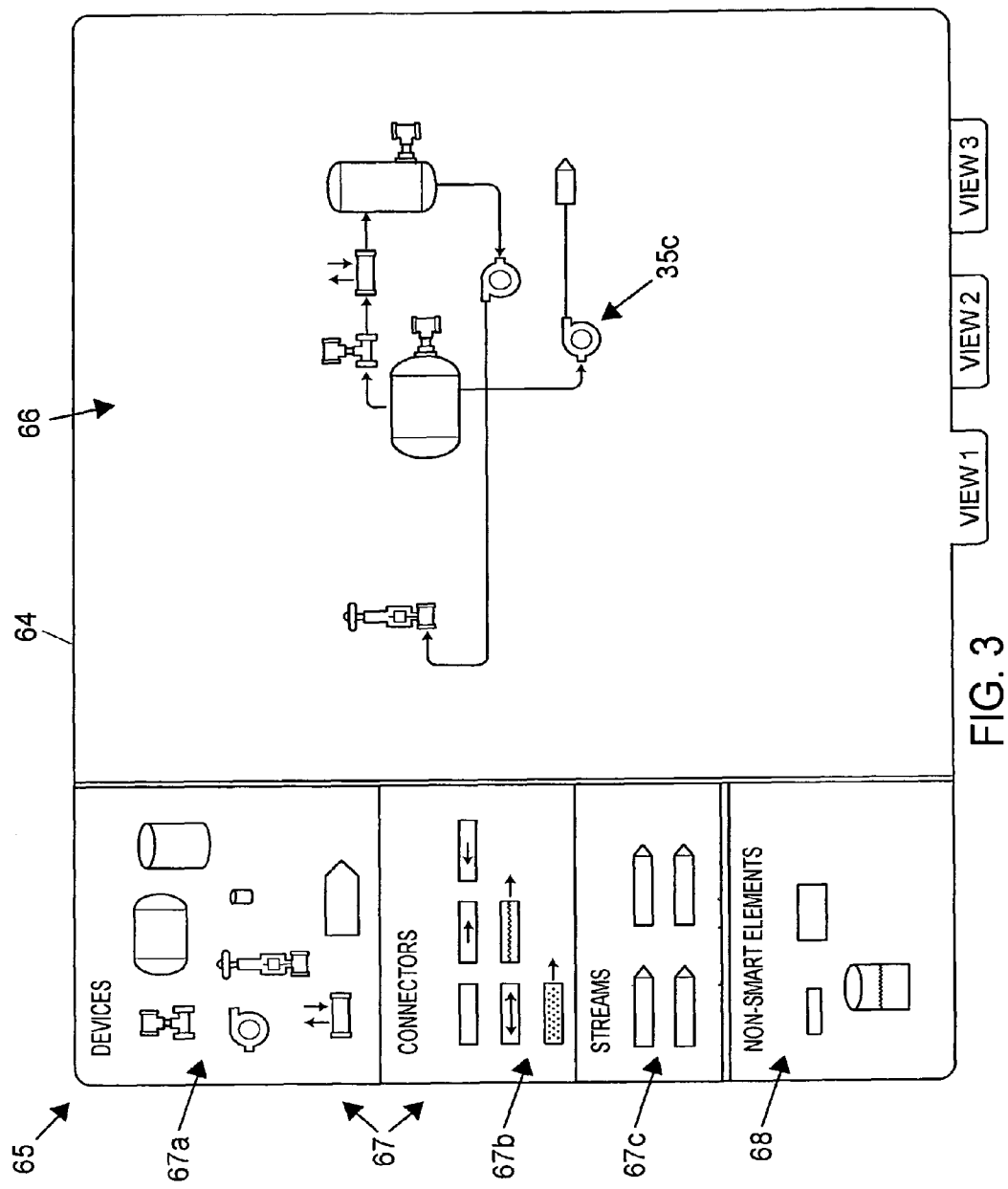
FIG. 3 is a simplified depiction of a configuration screen used by a configuration engineer to create a process graphic display or a process module using smart process objects stored in an object library.

Generally speaking, an operator may run or execute the configuration application 38 to create one or more process modules 39 or graphic displays for implementation during operation of the process 11 or for implementation in a simulation environment. In one embodiment, the configuration application 38 presents a configuration display, such as that illustrated in FIG. 3, to the configuration engineer. As seen in FIG. 3, a configuration display 64 includes a library or template section 65 and a configuration section 66. The template section 65 includes a depiction of sets of template smart process objects 67, which may include the smart process objects 42 of FIG. 2 and may be any of the connection, measurement, stream, processing, and estimated property elements described above. If desired, non-smart elements 68 that only have a graphic definition may also be provided. Essentially, the templates 67 and 68 are generic objects that may be dragged and dropped onto the configuration section 66 to create an instance of a smart process object within a process module or graphic display (or both). A partially completed process graphic display 35c is illustrated as including a valve, two tanks, two pumps, a flow transmitter and two sensors interconnected by flow path connectors, which may be smart links or connector elements as described above and providing a stream output. It will be noted that the graphic display 35c may be made up of both smart process objects and non-smart elements.

When creating a graphic display, such as the graphic display 35c (or a process module), the configuration engineer may select and drag the smart process objects 67 and the elements 68 illustrated in the template section 65 onto the configuration section 66 and drop them there in any desired location. Generally, the configuration engineer will select and drag one or more smart device process objects 67a or non-smart elements 68 depicting devices onto the configuration section 66. The configuration engineer will then interconnect the smart device process objects within the configuration section 66 with smart connector process objects 67b and may place input and output streams 67c into the display. Moreover, non-smart elements may be added to the display. The configuration engineer may change the properties of each of the smart process objects during this process using pop-up properties menus, etc. and, in particular, may change the methods, parameters, tags, names, hot links, modes, classes, inputs and outputs, etc. associated with these smart process objects. When the process or configuration engineer has created a process module with each of the desired elements, typically representing a process configuration, area, etc., the configuration engineer may define rules or other functionality associated with the module. Such rules may be execution rules such as those associated with the performance of system-level methods, like mass balance and flow calculations. The process engineer or operator may also decide to add trends and faceplates that would be useful when the process display is on-line. After creating the graphic display 35c, the configuration engineer may save that display in a memory and may, at that time, or later, instantiate and download that display to the execution engine 48 in a manner that the execution engine 48 may provide a graphic display. Of course, the configuration engineer could create a process module in the same or similar manner although different graphics may be depicted for process module elements as opposed to process graphic display elements. Furthermore, the operator may elect to turn on levels of detail while they are running the plant. For example, one of the levels of detail would show the composition at each connection.

As noted above, the process graphic or process module may be provided with a specific tag. For example, smart process objects elements within a graphics display or a process module may be provided a tag including an alias that can be filled in or selected at runtime by, for example, the execution engine 48 based on other factors, such as a piece of equipment or a route selected within the process control system. The use of alias names and indirect referencing in process control systems is discussed in detail in U.S. Pat. No. 6,385,496, which is assigned to the assignee of the present invention and which is hereby incorporated by reference herein. Any of these techniques may be used to provide and resolve aliases in tags for the smart process objects described herein. With the use of aliases and the like, the same process module may include or be used to support different views for sets of equipment, etc.

The display 64 of FIG. 3 illustrates tabs (View 1, View 2 and View 3) for different views of a process module or graphic display. These tabs may be used to access and create different views for different users associated with the process using some of the same smart process objects therein.

Generally speaking, when the configuration engineer creates a process module or a graphic display, the configuration application 38 automatically stores the smart process objects, along with the connections therebetween, in a database. This database can then be used to create other process modules and graphic displays which may, for example, provide different views using one or more of the same smart process objects. As such, when creating the second view, the configuration engineer can simply reference the smart process object, as already created and stored within the database, and any methods, etc. stored therewith to place that smart process object in the second view. In this manner, the database can be populated as the process control modules and graphic displays are created and the database can be used at any time to create and execute other views, modules, and graphic displays using smart process objects which already exist within the process flow database. Using such a database, each smart process object within the database may support or be used in process modules and referenced in multiple graphic displays. As will also be understood, the process modules may be constructed by building displays for these modules and then specifying flow algorithms to be used in or associated with process modules. Of course, individual process modules may be spread across and executed by different computers and process modules may be communicatively connected to one other to operate in conjunction with each other, either on the same or on different computers. When this is done, input and output streams will be externally referenced to tie process modules together.

As noted above, the configuration engineer may, as part of the process module or graphic display creation, attach or provide the simulation algorithm of the process module. These simulation algorithms may be preconfigured to calculate or determine certain process or system-level properties, such as mass balance calculations, flow calculations, efficiency calculations, economic calculations, etc. with respect to the process depicted or modeled by the process module. As a result, the process modules themselves may have mode, status, and alarm behavior, can be assigned to workstations, and may be downloaded as part of the display downloads. If desired, the simulation algorithms may be executed by the execution engine 48 to perform mass or heat balancing, flow routing, flow efficiency, flow optimization, economic calculations related to process simulation or other desired calculations using the data provided in the smart process objects of the process module. Still further, these simulation algorithms may access parameters from the control strategy, i.e., the control modules associated with and downloaded to the controllers, field devices, etc. and may, conversely, provide data or information to these control modules.

It will be understood that the execution engine 48 is needed to enable the process algorithms to execute across an amalgamation of all process objects and links configured on all displays. Thus, the simulation algorithms (within the process modules) will generally execute regardless of whether any associated graphic display is loaded, i.e., called up and displaying information to a user. Of course, the simulation algorithms may be cross-checked across the entire process 10 or across defined subsets of the process 10. It will also be understood that, during execution of any particular process module, the execution engine 48 may provide a display to an operator on an operator interface depicting the interconnected objects or entities within the process module based on the graphic display associated with that process module. The parameters, graphics, etc. of the display will be determined by the configuration and interconnection of the smart elements within the process module. Furthermore, alarms and other information to be provided on this or other displays may be defined and generated by the methods within the smart process objects and the simulation algorithms associated with a particular process module. If desired, the execution engine 48 may provide a display for a process module to more than one operator interface or may be configured or set to provide no display, even though the execution engine 48 continues to execute the process flow module and thereby perform the methods, alarm behavior, flow algorithms, etc. associated therewith.

If desired, a process module may be automatically generated from a graphics display (or vice versa) and the functionality available to the process module is determined by the process graphic elements. What should be clear is that the process module is preferably constructed to shadow the process graphic display. As a result, when the user configures a process graphic display, the user has the ability to include additional information for the process module such as mass or energy streams. These streams are used in the process module to establish starting conditions needed by the simulation function blocks.

Additionally, because process modules are actual software modules run in a computer, it is also possible for them to reference, and be referenced by controller modules to use the parameters, control strategies, displays, etc. associated with the controller modules. Also, using this capability, it is possible for a process module to be created independently of the process graphic display.

Generally speaking, process modules will be made of processing elements, streams, and their associated connections. Because there is a one-to-one correspondence between the process graphics elements and the simulation elements (in the process modules), it will be possible for a user to construct a graphic display and to automatically generate the corresponding process module from that display. Of course, if desired, the user may create the process module and then automatically create the graphic display from that module using the graphics within the smart process objects. However, to allow the automatic generation of a process module, it may be necessary for the user to identify the actuator, connection or processing element properties associated with the measurement elements and estimated property elements. A user may also need to create a process simulation before creating the process graphics or, in some cases, before the control modules are constructed. After the simulation is constructed, it will be possible to fill in the references to the I/O blocks in the control module. Also, when the associated graphic display is created, it will be possible to browse to the existing process module to set the property references.

In some cases the process graphic may not contain all the detail needed to construct the process simulation. Thus, it is desirable to provide an editor to enable the user to edit the simulation or process modules that have been automatically created from a process graphic. Also, because multiple process graphics may need to display the same piece of equipment, it may be necessary in the construction of a process graphic for an element to be able to reference an existing process module.

Generally speaking, the simulation that corresponds to the processing elements will have a common structure. If desired, the block input connections and the parameters of the simulation is stored in the process module so that no reference to a control module is needed. Furthermore, the number of input and output connections supported by the simulation may be defined as extensible, results from the simulation execution may be reflected in the simulation output connections or as parameters of the simulation and the simulation algorithm may be defined as a step response or may be entered by the user. When the simulation algorithm is entered by the user, the user may independently specify a dynamic for each output.

Still further, a common set of parameters may be supported for input and output connections. The parameters associated with input and output connections may be communicated between blocks as an array parameter or structure and may include parameters such as a connection status (e.g., good, bad, limited, etc.), a mass flow parameter, a pressure parameter, a temperature parameter, a specific heat parameter, a density parameter or any other desired parameter. In some cases, other parameters such as the composition of a stream may be provided and used in the simulation algorithm. To support this requirement, a standard and extended stream element may be provided. As part of the extended stream element configuration, the user may select a set of pre-defined groups of data to define the stream element. Such extended connections will only be allowed to connect to a block that utilizes this information. In general, the extended parameters may include a group name and a number of specific elements. For example, a fuel input stream to a boiler processing element may contain the components of the fuel including a fuel set, the amount of carbon, hydrogen, sulfur, oxygen, moisture and nitrogen in the fuel (all in weight % if desired). As another example, a turbogenerator processing element may use a steam stream and the connections to the associated simulation may use an extended parameter set that includes a steam set, steam enthalpy (actual) entering the stage, steam enthalpy (actual) exiting the stage, steam enthalpy (if isentropic expansion), etc.

The expanded group set may also be used when simulation elements within a process module are used as an interface to high fidelity simulation packages. In this case, the composition of some streams can be made visible in the process graphic. Also, if desired, an interactive editor may be provided to make it easier to create or modify the values displayed on a graphic display, as well as associated faceplates and detail displays for control modules to be presented on the graphic displays.

Figure 4:
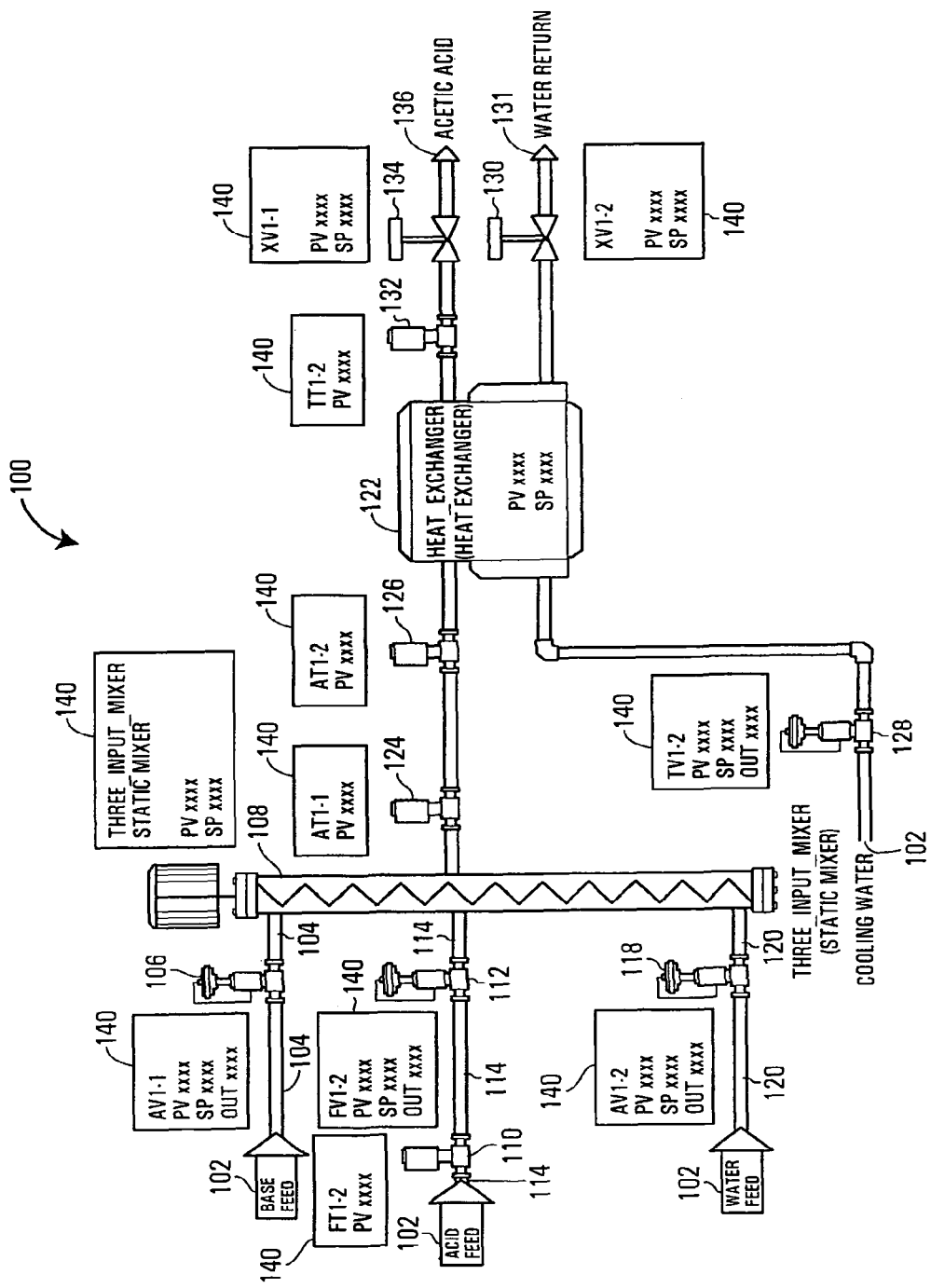
FIG. 4 is a detailed depiction of an example process graphic display including the depiction of streams and connection elements within the process plant, created by interconnecting the graphic display elements of a number of smart process objects.

FIG. 4 illustrates an example graphic display 100 that may be created using the elements and configuration applications described above. In particular, the graphic display 100 depicts a portion of process plant that produces white vinegar from water, acid and a base. As illustrated in FIG. 4, the process graphic display 100 includes four stream elements 102 at inputs thereto defining the streams of Base Feed, Acid Feed, Water Feed and cooling water. The Base Feed stream 102 is delivered through a piping connection element 104 to an actuator element in the form of a valve 106. The output of the valve 106 is connected to a first input of a mixer 108 via a piping connection element 104. In a similar manner, the Acid Feed 102 is connected to a transmitter element 110 and then to a further valve 112 which is connected to the mixer 108. The Acid Feed 102 and transmitter 110, the transmitter 110 and the valve 112 and the valve 112 and the mixer 108 are connected via piping connection elements 114.

As can be easily seen, an output of the mixer 108 is connected to a heat exchanger 122 via piping and two transmitters 124 and 126. The cooling water stream 102 is delivered to the heat exchanger 122 via a valve 128 and exits the heat exchanger via a valve 130 to produce a return water stream element 131. Likewise, the output of the heat exchanger 122 is delivered through a transmitter element 132 and a valve 134 to provide an output Acetic Acid stream element 136. While not always called out in particular, the elements in the graphic display are in all cases connected with one another via piping connection elements.

It will be understood that display boxes 140, which may be generated as properties of the display elements themselves or which may be separate elements in the form of transmitter and estimated property elements or elements that reference blocks in control modules, are illustrated in the graphic display 100 to indicate or expose parameters, such as process variable (PV) values, setpoint (SP) values, OUT values, etc. associated with the different elements. Additionally, if the user were to place a cursor over some of the elements, the display 100 may illustrate other values associated with the referenced elements. For example, placing the cursor over one of the stream elements (such as the Acetic Acid stream output 136), may cause the graphic to indicate the composition, pressure, temperature, density, flow rate, etc. of the acid stream at this point in the process. Of course, the values and parameters displayed on the graphic display 100 may be delivered from an actual referenced transmitter within the process control system (such as from an AI block in the control system), or from a process module simulation element that simulates the functionality of the element. The graphic display 100 of FIG. 4 may be provided to a user during operation of the process which makes white vinegar or to implement a simulation of that process to be used, for example, to perform design or operator training activities.

Figure 5:
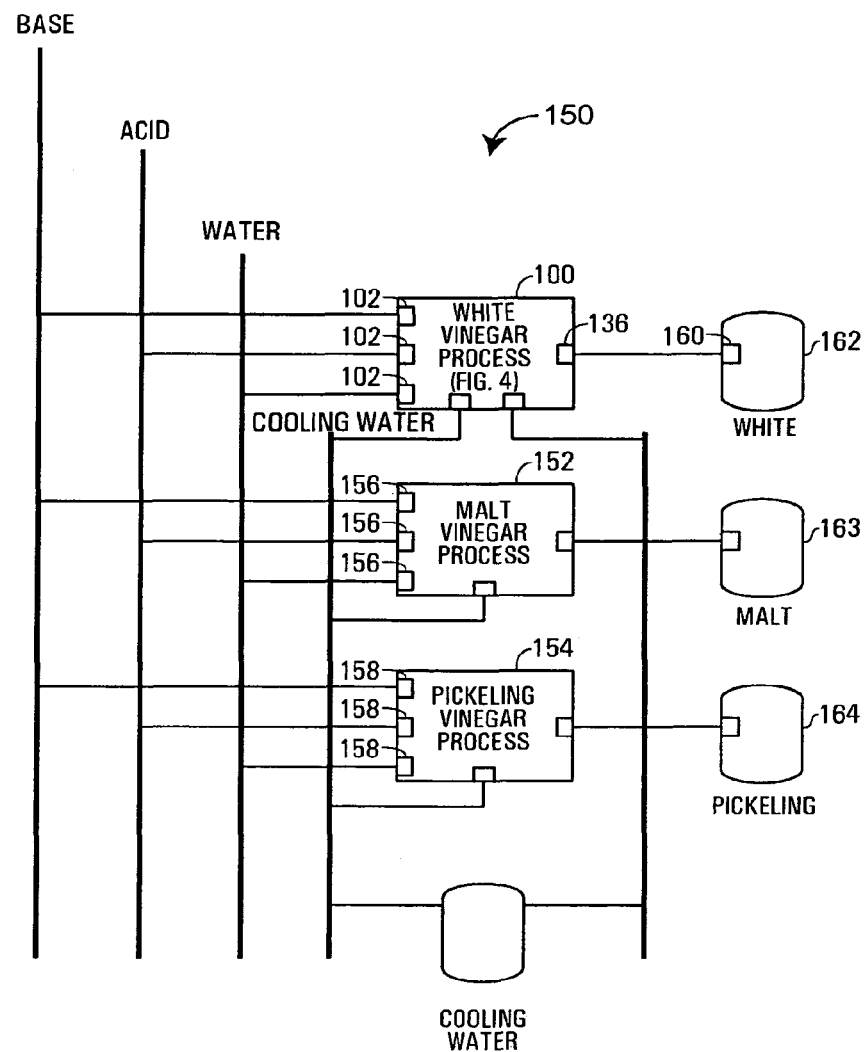
FIG. 5 is a depiction of a set of minimized process graphic displays, including the process graphic display of FIG. 4, interconnected into a larger graphic display for the plant.

FIG. 5 illustrates a manner in which different graphical displays (and similarly, in which different process modules) may be connected together to form higher level displays (or process modules) illustrating (or simulating) more of the process plant. In the display 150 of FIG. 5, the process graphic 100 is collapsed into a box that has a name or label and a set of stream inputs and outputs shown as connection points. If desired, the user may expand the process graphic 100 of FIG. 5 into that shown in FIG. 4 by selecting and, for example, double clicking on that graphic. Additionally, other collapsed graphic displays 152 and 154 are illustrated as being connected to the base feed, acid feed and water feed, as well as to the cooling water feed via input stream elements 156 and 158. The stream output 136 of the process graphic display 100 is connected to a stream input 160 of a holding tank 162 for white vinegar. In a similar manner, the stream outputs of the process graphic displays 152 and 154 are connected to stream inputs of holding tanks 163 and 164 for malt vinegar and picketing vinegar, respectively. As will be understood, the process graphics 152 and 154 are configured to provide graphics for portions of the process plant that make malt vinegar and picketing vinegar, respectively, and data and graphic views pertaining to these sections of the process plant may be viewed by expanding these displays.

FIG. 5 illustrates, however, that different graphical sections of the process plant may be connected together via connections between stream elements. In particular, the stream elements may be included in a display to define the starting properties associated with a connection element. Also, stream elements may be used as connection points between displays. For such off-sheet connections between displays, the user may click on the stream to immediately call up the associated display that contains the referenced connection. Thus, generally speaking, the mass/composition of the stream element will normally be used to define the starting properties of a process input, i.e., the starting feedstock composition, etc. or to define a link to a stream connection on another display. Connections may be made on the input or output of the mass/composition stream element. For stream elements, the user may generally configure the name of the stream (which should be unique within the system), the properties of the stream (if there is no reference input or input connection), the mass fraction of the different components of the stream (if the stream is made up of more than one component), the pressure or mass flow, the temperature, the specific heat, the density, the required connection type (pipe, duct, conveyor) and the referenced input stream (if used for accessing a stream on another display). Likewise, an energy stream element may be used to define the starting energy associated with a process input, e.g., the BTU/HR transfer, etc. or to define a link to the energy properties of a stream connection on another display.

While FIG. 5 illustrates the use of streams to interconnect different collapsed graphic displays, the same procedure could be used to interconnect (and to illustrate the interconnection of) different process modules. In particular, process modules could be collapsed to illustrate a name and stream element inputs and outputs and these collapsed process modules could be communicatively tied or connected to other process modules using depictions of communication connections or links between the stream outputs and the stream inputs of different process modules.

Figure 6:
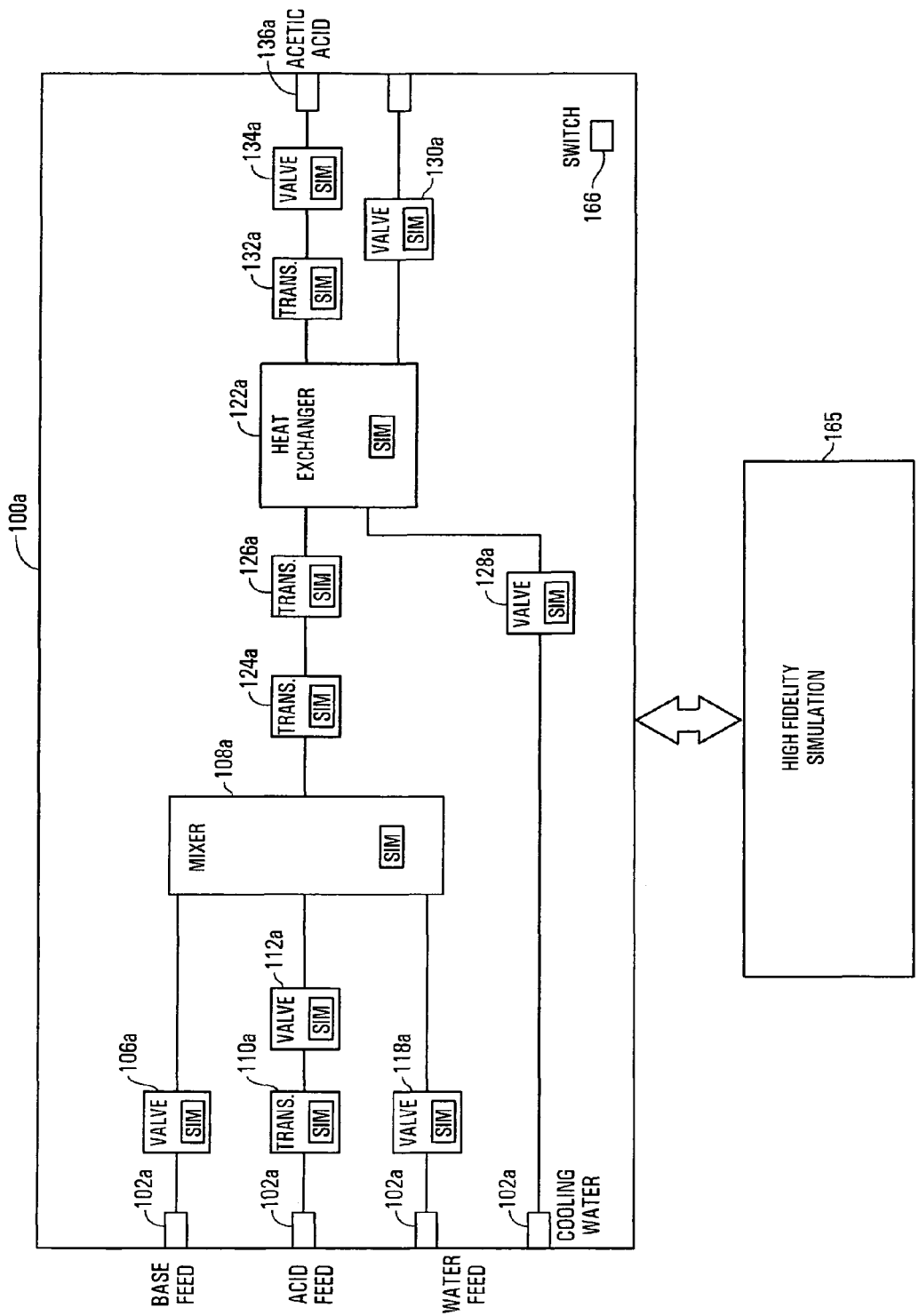
FIG. 6 is depiction of a process module associated with the process graphic display of FIG. 4, also illustrating the interconnection of a high fidelity simulation routine therewith.

FIG. 6 illustrates a process module 100a which corresponds to the graphic display 100 of FIG. 4. As will be seen, the process module 100a includes blocks that represent smart object simulations for each of the physical elements depicted in the graphic display of FIG. 4. For ease of understanding, each simulation block in FIG. 6 corresponding to an element in FIG. 4 is designated with the same reference number with an "a" added. Thus, the mixer simulation block 108a of FIG. 6 is a simulation corresponding to the mixer 108 depicted in FIG. 4. Similarly, the valve simulation blocks 106a, 112a and 118a correspond to and are communicatively tied to the valves 106, 112 and 118, respectively, depicted in FIG. 4.

The process module 100a of FIG. 6 thus includes a process simulation element (which may be represented as a function block associated with or specified by a smart process object) for each element depicted in the graphic display 100 and these simulation blocks are interconnected in the manner and using the connection elements specified in the graphic display 100. If desired, the process module 100a may be created automatically after creation of the graphic display 100 or even during creation of the graphic display 100.

As indicated above, each of the process simulation elements in the process module 100 includes simulation functionality (e.g., an algorithm, rules, transfer function, etc.) that is based on the behavior of the mechanical device used in the process and the nature of the stream(s) of material provided at the inputs to these simulation elements. These simulations are illustrated in FIG. 6 by the SIM blocks within each of the processing, actuator and transmitter elements. The dynamics of the devices and the effects on the streams may thereby be modeled or simulated within the process module 100a. Some possible properties that will be available for simulation blocks associated with actuator and processing elements may be outlet temperature (based on inlet temperature, flows and heat capacity), outlet flows (based on inlet mass flows and accumulation within the element), outlet pressure (based on assumed pressure drop across the unit or downstream pressure) and outlet composition (based on perfect mixing and inlet composition). When custom calculations are implemented, the built-in dynamics associated with the outlet properties may be added based on, for example, a first-order-plus-deadtime response to changes in the process inputs. The user may specify the deadtime and lag associated with each calculated property if desired. For process measurement elements, e.g., transmitters and switches, and connection elements, it may be assumed that no dynamics are introduced in the referenced property. However, transitions and other properties may be modeled if so desired. However, in many cases, the properties from the upstream connection may be immediately reflected in the downstream connection.

Using the process module 100a, the operation of the portion of the plant depicted in the process graphic 100 can be simulated. This simulation is integrated with the display 100 as values from the simulation elements within the process module 100a may be automatically communicated to and displayed in the graphics of the graphic display 100 and used in the control module. Similarly, the training instructor may use the display to effect or change properties in the simulation performed by the process module 100a.

If desired, a high fidelity simulation, such a one provided by HYSYS, CAPE, etc., may be added to the simulation features by defining I/O references for measurement and actuator elements and then using these references to automatically create the DCS interface table that is currently used in for example, HYSYS to perform I/O in a simulation. Standard processing element templates may be defined for each HYSYS (or other high fidelity simulation) component that may used to construct a high fidelity process simulation. Such a high fidelity simulation 165 is illustrated in FIG. 6 as being communicatively connected to the process module 100a. In this case, the user may select to disable the simulation provided in each of the simulation elements in the process module 100a and, instead, use the simulation parameters provided by the high fidelity simulation 165. The user may specify the use of the high fidelity simulation 165 by activating a switch 166 (which may be an electronic switch, a flag, etc. set within the process module 100a).

Generally speaking, when the switch 166 is set to use the high fidelity simulation 165, the associated simulation function blocks in the process module 100a act as shadow blocks, i.e., their simulation algorithm (SIM block) is not executed and the block parameters are instead read and written by the high fidelity simulation 165. However, the blocks in the process module 100a still communicate the same parameters and other information to the process graphic and control module and receive information from the process graphic 100 (ultimately for use in the high fidelity simulation 165) and control module 29.

As will be understood, the use of the process module in this manner provides an easy and convenient manner of connecting a high fidelity simulation package (software product) within a process plant in a manner that can be viewed and used by an operator, engineer, etc. (i.e., using the process graphic display 100 associated with the process module 100a). In particular, the stream parameters of the process modules may be connected up to or associated with flows modeled in the high fidelity simulation and pathing within the process module can be automatically structured or associated with the pathing within the high fidelity simulation. In effect, the process modules are used, in this case, as variable or data place holders that provide a convenient manner of mapping data within the high fidelity simulation package to the control modules and the graphic displays used in the process plant control and simulation environment.

Still further, the process modules and associated graphic displays reduce or eliminate the need to provide a separate display for the high fidelity simulation, which is typically currently produced by the high fidelity simulation provider at high cost to the user. Instead, because the process modules are already tied to graphic displays, when the process modules are connected to a high fidelity simulation package, the graphic displays may be used to provide information as calculated by the high fidelity simulation package to the user and to enable the user or operator to manipulate inputs to the high fidelity simulation package. Still further, because the process modules are communicatively connected to the control modules, the parameters or data generated by the high fidelity simulation package may be used in the control modules to perform on-line control activities. Using the process modules in this manner, a high fidelity simulation package can be executed in parallel to, in addition to being integrated with, the control modules.

As will be understood from the discussion provided above, the process modules and graphic displays may be created and run in an integrated manner to provide an operator view of a section of the process plant 10 along with a process module that simulates the operation of the process plant depicted by the graphic display. Advantageously, the process module and the graphic display may additionally be integrated with (e.g., communicatively connected with) one or more control modules that perform control activities with respect to that section or portion of the process plant. Thus, the control modules 29 illustrated in FIG. 1 may be communicatively integrated with one or more of the process modules 39 and graphic displays 35 illustrated in FIG. 1. Of course, the control modules 29, the process modules 39, and the graphic displays 35 may be implemented in any other computers or devices within the plant 10, as desired or necessary in any particular case, other than those illustrated in FIG. 1.

Figure 7A:
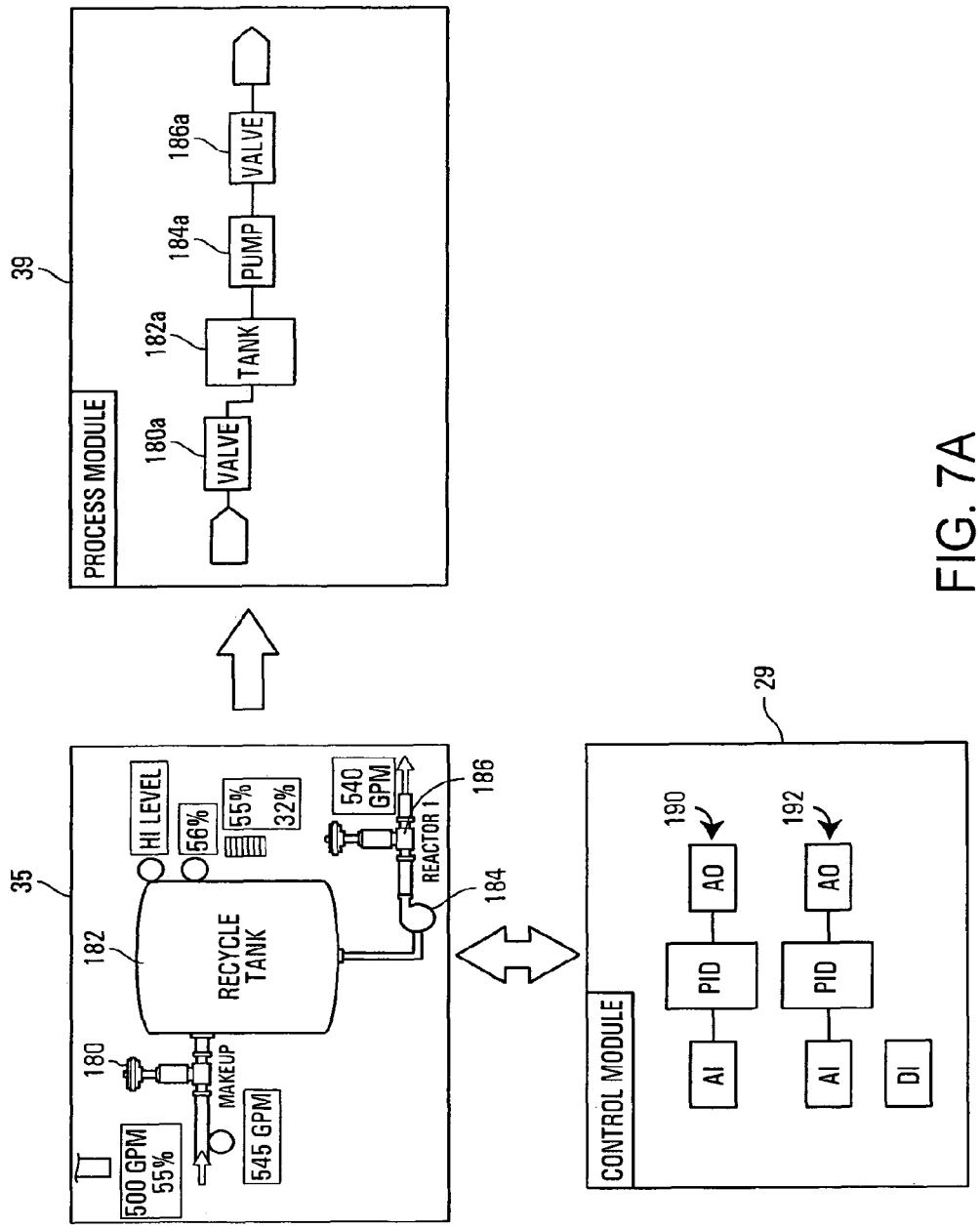
FIGS. 7A and 7B are logical block diagrams illustrating the communication interconnections between a graphic display, a process module and a control module as integrated within a process plant.
Figure 7B:
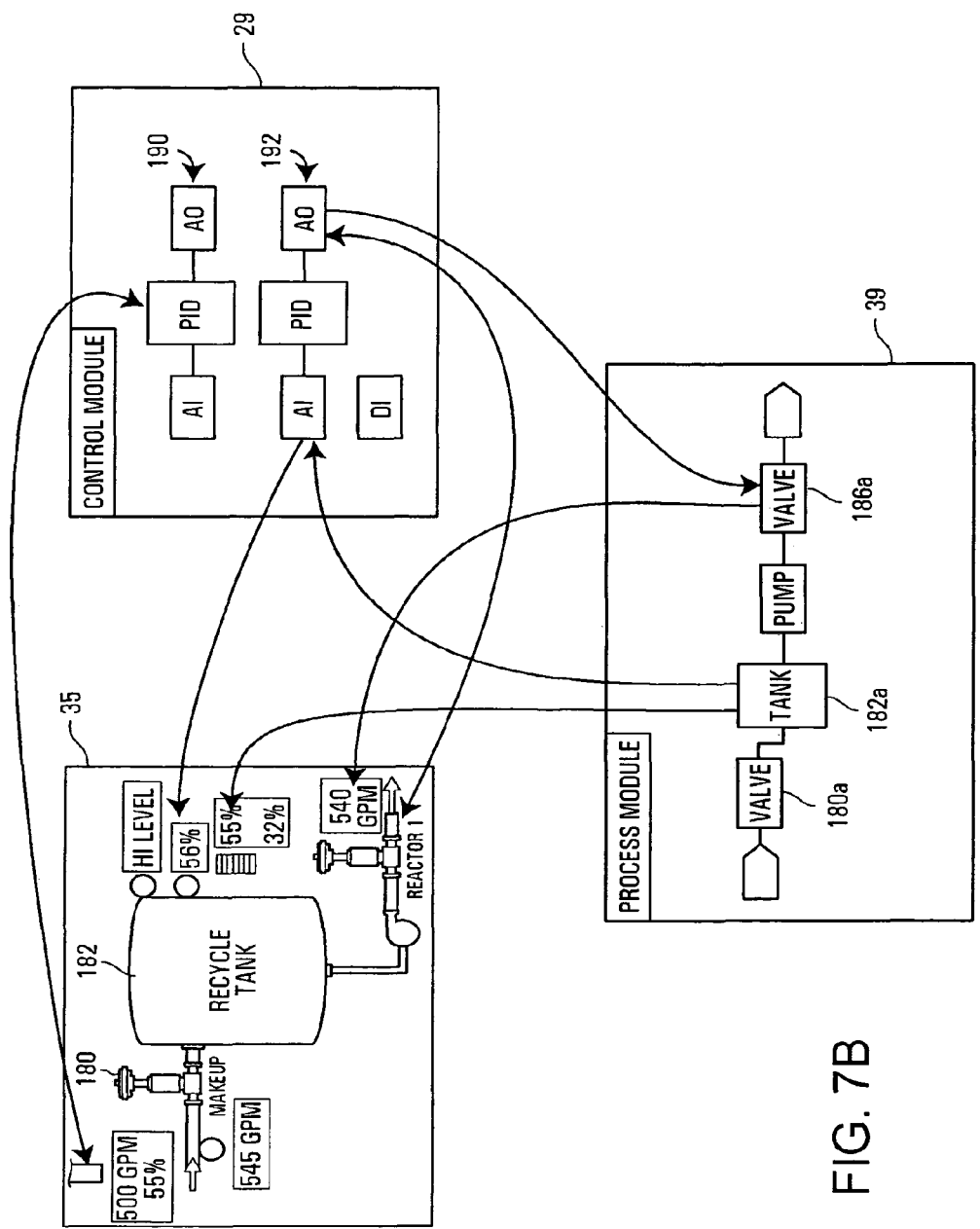

FIGS. 7A and 7B illustrate the integration of a control module 29, a process module 39 (used as part of a simulation system) and a graphic display 35 in more detail. In particular, the graphic display 35 includes a valve 180 connected to an input of a recycle tank 182 and a pump 184 along with a valve 186 connected in series with an output of the recycle tank 182. The elements 180-186 are connected together via piping connection elements (not labeled) and stream elements are provided at the inputs and outputs of the graphic display 35 to define the streams of materials at those points.

As a result of the configuration of the graphic display 35, the process module 39, which may be created at the same time as the graphic display 35 includes process simulation elements in the form of a valve element 180a, a tank element 182a, a pump element 184a and a valve element 186a corresponding to the physical elements depicted in the graphic display 35. The control module 29, which controls at least some of the physical elements associated with (depicted in) the graphic display 35 includes a set of interconnected function blocks which provide control within or associated with the elements depicted by the graphic display 35 and by the process module 39. In this example, the control module 29 includes two control loops 190 and 192. The first control loop 190 has an analog input (AI) function block that receives flow input information about the flow of fluid into the tank 182, a proportional-integral-derivative (PID) control function block that performs PID control and an analog output (AO) function block that operates the valve 180 to effect the desired flow of material into the tank 182. In a similar manner, the control loop 192 includes an AI function block that provides tank level information as measured by a level sensor within the tank 182, a PID control block and an AO function block that receives a control signal from the PID control block to operate the valve 186 to effect control of the level of fluid within the tank 182. The control module 29 also includes a discrete input (DI) function block that indicates, for example, the on/off state or operation of the pump 184 and which may be used by the control loops 190 and 192 if so desired to perform control activities with respect to the tank 182.

As will be understood, any of the elements within any of the graphic display 35, the process module 39 and the control module 29 may communicate with others of those elements (via associated communication tags) to provide information back and forth between these different entities to thereby provide for better or enhanced control, simulation and operator displays, as will be explained in more detail. For example, as illustrated in FIG. 7B, the PID control block of the loop 190 may be configured to provide information to the graphic display 35 to display the current flow setpoint being used by the PID control element or may read the setpoint to be used in the control module 29 from the graphic display 35, as indicated by the arrowed lines between these elements. In a similar manner, the tank element 182a of the process module 39 may provide a simulation output to the AI function block of the control loop 192 of the process control module 29 indicating the simulated level of the tank, as determined by the simulation algorithm within the element 182a. This simulated tank level may also be illustrated on the graphic display 29 as additional information for viewing by the operator.

If desired, the AO block of the control loop 192 may provide information to and receive information from the valve 186 of the graphic display 35. Additionally, the AO function block of the loop 192 can be configured to provide its control output to the valve element 186a of the process module 39. In this case, the valve element 186a may compare a predicted value for the valve position with an actual valve position being measured in the control loop 192 to determine if there may be some malfunction in the physical element. In the case of a difference over a certain amount, the process module 39 may include software that generates an alarm or an alert on the graphic display 35 that indicates a potential problem within the process plant, such as a faulty sensor, etc. As also illustrated in FIG. 7B, the valve element 186a may provide a simulated measurement or parameter to the graphic display 35 to be displayed or made available to the operator. Such a simulated measurement or parameter may indicate a simulated or predicted flow from the valve 186 or any other simulated parameter associated with the valve 186. Of course, any other desired information or data, including actual measured data, simulated data, or graphic display data may be provided to elements in the graphic display 35, the process module 39 and the control module 29 to provide for better or enhanced control, simulation or display.

Generally speaking, there are numerous advantages that may result by integrating a process module with a control module and, if desired, additionally with a graphic display. In one case, as mentioned above, the simulation performed by the process module may compare a simulated or predicted measurement, parameter or other process value with a measured or calculated parameter provided by the control module to detect potential problems within the system. For example, a great difference between the flow out of the valve as calculated by the process module 39 and as measured within the process itself may be a reason to generate an alarm indicating some device problem exists. Conversely, the control module 29 may use a simulated parameter to provide enhanced control in a situation in which the control module 29 knows of a faulty sensor or other element that is no longer active or available to the control module. In this case, the control module 29 can automatically replace a measured value or parameter (which may be known to be faulty, which may have a bad status, etc.) with a simulated output, as developed by the process module, without needing operator involvement and without having to shut the process down. Also, displaying both simulated and actual control data on the same display may help the operator or user detect problems within the plant, useful in a simulation mode, useful to perform better design activities, etc.

Figure 8:
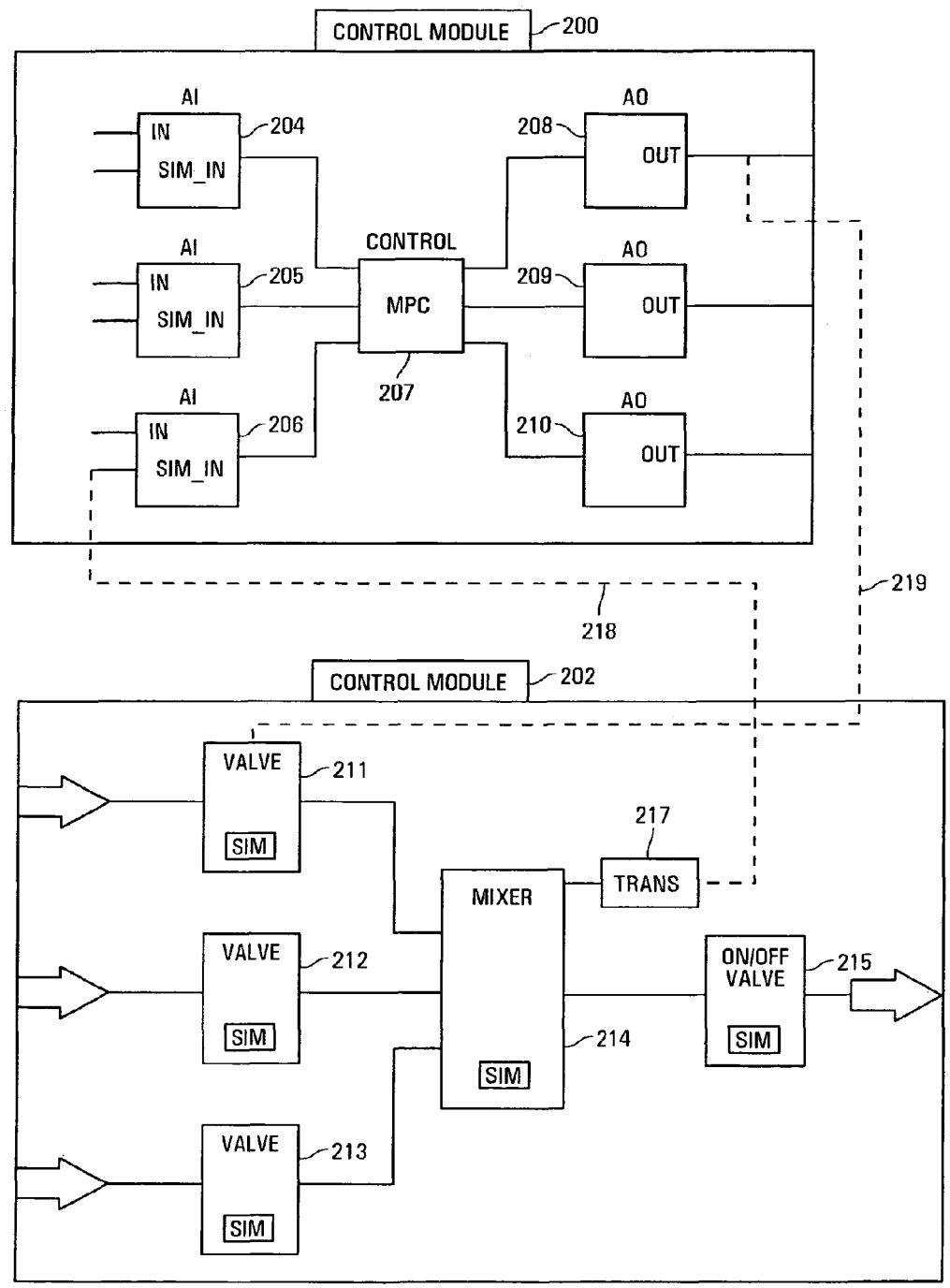
FIG. 8 is a simplified depiction of an example process module having blocks thereof interconnected with function blocks within a control module to provide advanced control and simulation capabilities.

FIG. 8 is a more detailed diagram of a manner in which a control module 200 may be communicatively integrated with a process module 202 (and thereby any graphic display associated with the process module 202). The control module 200 of FIG. 8 includes three AI function blocks 204, 205 and 206 having outputs thereof connected to a control function block 207, which may be, for example, a multiple-input/multiple-output control block, such as a model predictive control (MPC) function block. Three control outputs from the control block 207 are delivered to control inputs of three AO function blocks 208, 209 and 210 which may control, for example valves within a process that provide different fluids to a mixer for mixing.

The process module 202 is associated with the portion of the process having the mixer and valves controlled by the control module 200. In particular, the process module 202 has valves (actuator elements) 211, 212, and 213 which simulate the flow of three streams (depicted by arrows at the left hand side of the process module 202) into a mixer element 214. A valve element 215 simulates the flow of fluid out of the mixer element 214 to define an output stream on the right hand side of the process module 202 and a transmitter element 217 may indicate (or simulate) the measured composition of fluid exiting the mixer element 214. It will be noted that the connection elements, for the sake of clarity, are illustrated as simple lines in the process module 202.

In this case, the AO function blocks 208-210 may control the operation of the valves in the process plant depicted by the valves 211-213 (in the process module 202) while the control inputs to the AI function blocks 204-206 may be provided by a composition sensor, a flow sensor or other sensor in the process plant that is depicted by the transmitter 217 (in the process module 202).

As will be seen, logical elements within the process module 202 and the control module 200 may be communicatively interconnected to provide information from the process module 202 to the control module 200 and vice versa in desired or useful manners. In one example, a communication connection (illustrated by the dotted line 218) may be configured between the output of the transmitter element 217 of the process module 202 (which exposes the stimulated measurement of the material composition in the mixer 214) and a simulated input SIM_IN of the AI block 216 in the process control module 200. In this manner, the simulated measurement of the level of fluid in the mixer 214 is provided to the AI block 206, and the AI block 206 may use this simulated input when, for example, the signal at the control input (IN) of that block has a bad status or is known to be faulty for some reason. In this manner, the AI block 206 may still provide an approximated value of the measurement associated with the AI block 206 when the actual physical measurement is not valid or not available, thereby enabling the control module 200 to continue to function and provide control in the presence of a faulty sensor. Such a connection may also enable the control module 200 to run in a simulated mode in which valid simulation data (as provided by the simulation process module 202) is used during off-line operator training or to test the control module 200.

Alternatively, or in addition, a communication connection (illustrated by the dotted line 219) may be configured between the output of the AO block 208 in the process control module 200 and an input of the valve element 211 which models the actual valve being controlled by the AO block 208 in the process plant. Here, the valve element 211 may use data obtained from the actual valve or sent to the actual valve to determine whether the simulated data (i.e., the measurements and parameters calculated by SIM block of the valve element 211) is correct or matches with the data used in the actual control routine 200. If there is a significant difference, the process module 202 may generate an alarm or alert indicating a potential problem or may use the real data to provide better or more accurate simulation within the process module 202. For example, the valve element 211 may use the actual control data in the SIM block for the position of the valve element 211 to reflect the actual valve position in the simulation. Of course, other connections between the elements in the process module 202 and the control module 200 may be made to provide data flow in either direction between these two modules for performing enhanced control and/or simulation. Still further, any of the data from the process module 202 or the control module 200 may be automatically made available to the operator via a graphic display associated with the process module 202.

Figure 9:
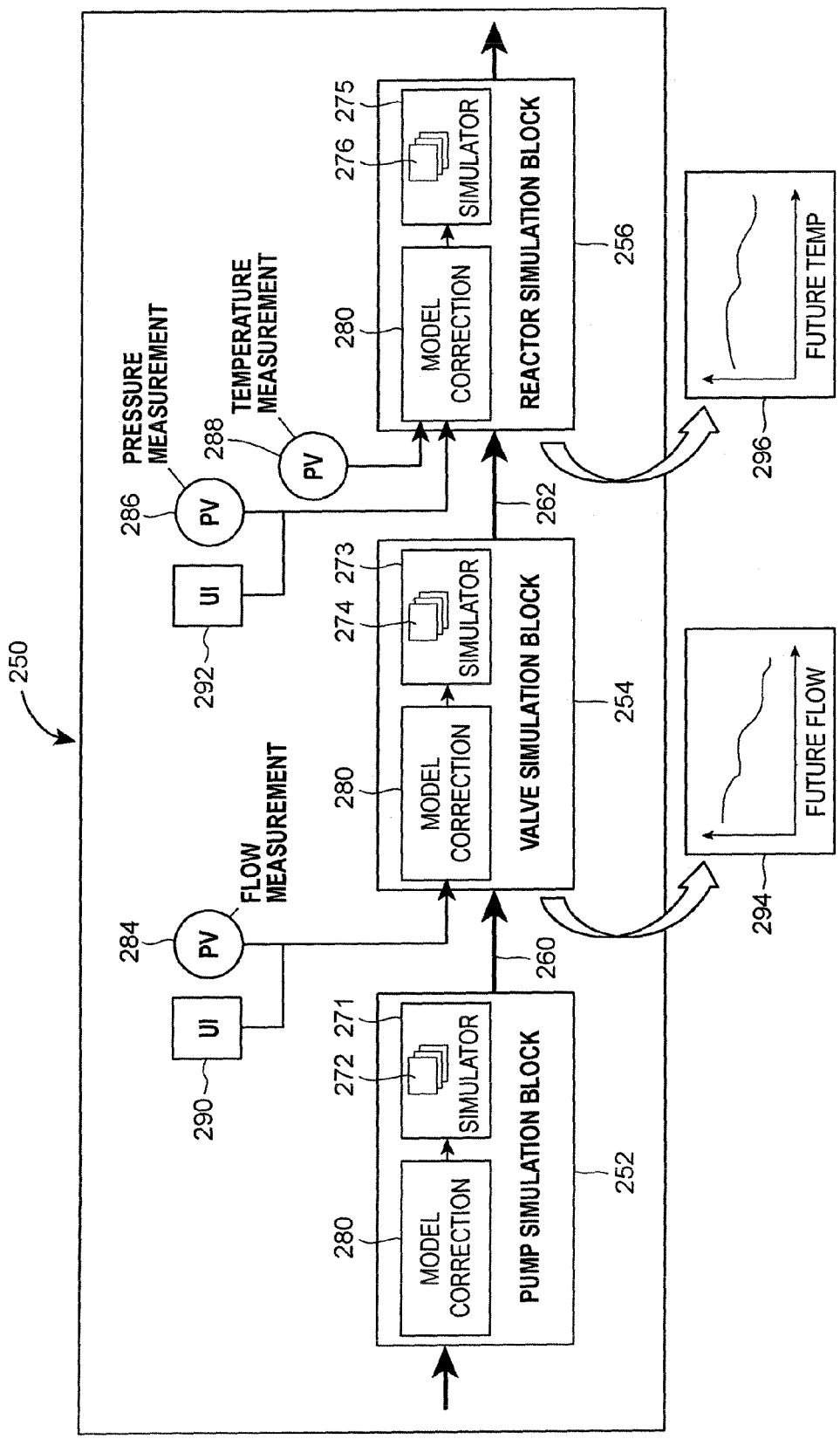
FIG. 9 is a simplified block diagram illustrating a simulation system having multiple simulation blocks which use process models to provide future predicted process values and which update the process models based on process measurements or user inputs.

FIG. 9 illustrates a simulation system 250 for a part or a portion of a process plant, the simulation system 250 being made up of multiple simulation blocks 252, 254 and 256, and if desired, smart connection elements 260 and 262 connecting the simulation blocks, 252, 254 and 256. It will be understood that, in certain embodiments, the simulation system 250 may be executed in parallel to (e.g., at the same time as or in conjunction with) a process control routine running within the actual process plant, and that the simulation system 250 may be connected to components of the process plant (or to the control system of the process plant) in a manner described in more detail below to perform enhanced and more accurate simulation activities.

In particular, as illustrated in FIG. 9, a pump simulation block 252 includes a simulation routine 271 that implements or uses one or more process (e.g., equipment) models 272 to simulate the operation of a portion of a process plant, such as the operation of a piece of equipment within the process plant. In particular, the simulation routine 271 uses various inputs to the block 252, as provided by for example, other simulation blocks, a control system, a user, etc., to simulate or estimate the flow, pressure and/or other process variable(s) developed by or at the actual pump device within the process plant that is being simulated. These flow, pressure, and/or other simulated variables, along with other characteristics of the flow or the material being pumped, such as viscosity, material balance, etc. are provided to a connection object 260 which delivers these measurements to the valve simulation block 254. If desired, the connection object 260 may be a smart connection object that processes the simulated output variables developed by the block 252 based on the simulated operation of the connection structure within the process plant, to provide simulated flow, pressure, etc. elements to the valve simulation block 254. Of course, the connection object 260 need not be a smart connection object but could simply be a link between the pump simulation block 252 and the valve simulation block 254 for providing an indication of the pressure, flow or other simulated process variables developed and output by the pump simulation block 252, Likewise, the valve simulation block 254 includes a simulation routine 273 that includes and uses one or more process models 274 (which may include equipment models) to model the operation of a valve based on measurements or conditions associated with the valve (valve position, etc.) and the simulated inputs to the valve simulation block 254 provided by the connection object 260. Again, the simulation routine 273 may use the process models 274 to simulate the operation of an actual valve within the process plant in any known manner to thereby produce one or simulated output variables, such as a simulated flow from the valve, a simulated pressure at the output of the valve, a simulated temperature of fluid within or at the output of the valve, etc. Indications of these simulated process variables may be provided to the connector object 262 which may process these variables to provide inputs to the reactor simulation block 256. Of course, again, the connector object 262 may simply be a communication link that provides the output(s) of the valve simulation block 254 to the input of the reactor simulation block 256.

As shown in FIG. 9, the reactor simulation block 256 also includes a simulation routine 275 which uses one or more process models 276 to simulate the operation of a reactor within the process plant, based on reactor conditions and variables (equipment variables) and the inputs to the reactor simulator block 256 provided by the connector object 262. The process models 276 are used to produce one or more simulated outputs of the reactor, which may include process fluid temperature, pressure, material balances, etc. Thus, as will be understood in this case, where the process simulation is implemented as one or more blocks that represent process equipment, then the outputs of these blocks represent the simulated process conditions that are calculated based on the inputs to the process simulation blocks.

The process models 272, 274 and 276 may be any desired types of process models, including parametric and non-parametric process models. For example, the process models 272, 274 and 276 may be first principle models, such as differential equations that describe energy and material flow through the process equipment, process models reflecting a series of impulse or step response input/output curves based on actual measurements made during operation of the process, such as those typically used in model predictive control (MPC) techniques, neural network models, fuzzy logic models, process models of the type disclosed in U.S. Pat. No. 7,113,834 entitled "State Based Adaptive Feedback Feedforward PID Controller," which issued on Sep. 26, 2006 and U.S. Pat. No. 6,577,908 entitled "Adaptive Feedback/Feedforward PID Controller," which issued on Jun. 10, 2003, the entire disclosures of which are hereby incorporated by reference herein, or any other types of process models. Moreover, the models used in the simulation blocks 252, 254 and 256 may be created in any manner, such as by a user or a designer specifically for the purpose of simulation. However, in some cases, these models may be copied from a portion of an on-line control system which uses process models to perform control or optimization activities. For example, MPC controllers typically generate a process model for use by the controller during on-line control activities, and this process model may be imported to one or more relevant or related simulation blocks for use in performing simulation activities for the MPC controller or a portion of the plant controlled by the MPC controller.

While the configuration of a simulation system such as that of FIG. 9 is useful in providing off-line simulation activities, it has been determined that it is also possible to run the simulation system 250 in an on-line or parallel mode with respect to the process plant and, in doing so, to automatically or semi-automatically update the process models 272, 274 and 276 to account for changes in the actual process plant that may occur after creation of the simulation system 250, to thereby provide for a better or more accurate simulation system. In particular, by adding additional standard inputs to the simulation blocks of the simulation system 250, such as to the blocks 252, 254 and 256, wherein the standard inputs represent actual process measurements associated with the output parameters of the simulation blocks 252, 254 and 256 (e.g., corresponding to the block output parameters), it is possible, as part of the simulation algorithm, to automatically correct the process models 272, 274 and 276 used by the simulation blocks 252, 254 and 256 to compensate for the differences between the calculated (simulated) outputs and actual measurements of the simulated parameter as measured within the operating or on-line process.

Thus, as illustrated in FIG. 9, each of the simulation blocks 252, 254 and 256 includes a model correction block 280 which may be used to periodically update or regenerate the process models 272, 274 and 276 within the process simulation blocks 252, 254 and 256 based on feedback from the actual process and/or if desired, from a user. More particularly, the model correction blocks 280 may use a measurement indicative of an actual process variable (e.g., as measured within the process plant by, for example, the control system) and compare this measured process variable (PV) to the output of the simulation block corresponding to the measured process variable (for the same time as the measured process variable). The model correction block 280 may use this comparison to update or modify the process models used within the process simulation block in developing the simulated output. In accordance with this feature, a single PV flow measurement 284 is illustrated as being fed back from the process plant (e.g., by the control system used within the process plant) to the valve simulation block 254 to be used by the model correction block 280 within the valve simulation block 254. Here, the PV flow measurement 284 is or represents the measured flow output of the valve within the process plant that is being simulated by the valve simulation block 254. Likewise, a PV pressure measurement 286 and a PV temperature measurement 288 are illustrated in FIG. 9 as being fed back to the reactor simulation block 256 for use by the model correction block 280 of the reactor simulation block 256. In this case, the PV pressure measurement 286 and the PV temperature measurement 288 represent actual measurements of the pressure and temperature at the output of the reactor being simulated by the reactor simulation block 256. Of course, other types and numbers of PV measurements may be fed back to the simulation blocks 252, 254 and 256 with the nature and identity of these measurements typically being chosen based on the specifics of the process model or simulation being performed.

In any event, using these measured feedback signals from the process plant, the simulation blocks 252, 254 and 256 may change or be updated during ongoing operation of the process plant to more accurately reflect process operation. This updating may include calculating compensation or update factors to be applied to the outputs of these models. In this manner, the simulation system 250 adapts to the changing conditions within the process plant, to non-modeled changes, to non-linearities introduced into or associated with the plant, and to other changes in the plant, to provide for a more accurate simulation.

Besides performing better simulation, and thus producing more accurate simulated or predicted process variables, the adapted or regenerated process models 272, 274 and 276 developed by the simulation system 250 may be exported (periodically or when updated) to perform other activities within the process plant, such as control activities, user interface activities, optimization activities, etc. For example, if the models generated or updated within the simulation blocks 252, 254 and 256 are step or impulse response models, these models may be provided to an MPC controller to be used for MPC matrix and controller generation. An example of a combined MPC and optimizer system in which these updated models produced by the simulation system may be used for MPC controller generation, optimizer generation, etc. is disclosed in U.S. Pat. No. 7,050,863, entitled "Integrated Model Predictive Control and Optimization within a Process Control System," which issued on May 23, 2006, the entire disclosure of which is hereby incorporated by reference herein. Thus, in this case, a simulation block may be created that utilizes a step response or a finite impulse response model to simulate a complex piece of equipment, process control loop or process response. For example, the DeltaV MPC_SIM block is designed to provide simulation in this manner. If such an approach is taken, then correction for on-line measurements similar to that performed in MPC control may be easily implemented to change or correct the process models 272, 274 and 276. Likewise, the process models 272, 274 and 276 may be other types of models such those described in U.S. Pat. Nos. 6,577,908 and 7,113,834 and may be re-used in an adaptive PID control technique described in these patents. As a result, the simulation blocks 272, 274 and 276 or parts thereof, may actually be provided back to the control system for use in control of the process plant. Moreover, if desired, different sets or combinations of process models from different simulation blocks may be combined and provided back to be used in on-line process operations, such as control and optimizer operations. Moreover, in one case, a process model may be developed for a control or optimizer or other routine used during on-line control activities, may be imported from the control system to the simulation system, may be updated in the simulation system as described above, and may then be provided back (in its updated or adapted state) to the control system for use by the controller or optimizer for which the non-adapted model was originally created.

While feedback of process measurements may be used to automatically correct the process models 272, 274 and 276 used in the simulation blocks 252, 254 and 256, a user may also provide manual feedback in some instances to correct the models 272, 274 and 276 used within the simulation blocks 252, 254 and 256. For example, in some cases, a process variable measurement may not be available for some reason, such as due to a faulty sensor, a communication problem, etc., or the measured process variable may be known to be faulty (e.g., suspect in accuracy) due to a status condition associated with the measurement. In other cases, process variable measurements may be made off-line, such as in a laboratory, and therefore may not be available directly from the control system of the plant. In still other cases, a certain process variable or other variable used by one of the model correction blocks 280 may not actually be measured, but may be estimated or otherwise only provided by a user. In these cases, it is desirable to enable a user to provide an indication of the actual value of a simulated process variable to be used by the model correction blocks 280. This technique is illustrated in FIG. 9 by the UI blocks 290 and 292 which may be tied to or communicate with a user interface or other device that enables a user to specify a value of a process variable to be used as the "correct" or "measured" variable corresponding to the output of the simulation block (254 or 256), and thus to be used to perform model correction. In this manner, a user may cause the simulation blocks 252, 254 and 256 to correct the models used therein as well as to specify the values to be used to perform this correction. Of course, while only two UI blocks allowing user control of the feedback to the simulation blocks 254 and 256 are shown, it will be understood that any number of UI feedback paths or connections may be provided to any simulation block for any desired feedback variables, and that these UI connections may be provided in addition to or instead of connections to process variable measurements made by sensors or other elements within the control system.

Still further, where both a measured process variable and a user provided variable are provided to a simulation block, the simulation block may use one of these inputs as a primary input and the other input as a backup input to be used when the primary input fails, is unavailable or produces clearly incorrect results. Thus, for example, a simulation block may automatically or primarily use the measured PV signal fed back from the process control network to perform model correction. However, if the measured PV signal fails, is unavailable, is known to be faulty or produces clearly incorrect results, the model correction block 280 may use the input of the process variable provided by the user instead.

Moreover, it is possible, as part of the simulation algorithm used in any of the simulation blocks 252, 254 or 256, to calculate the future values of the output parameters of the block, instead of just the current values. Thus, as illustrated in FIG. 9, the valve simulation block 254 may provide a graph or a trend chart 294 of the simulated flow out of the valve being simulated over a specific future time period to a user at, for example, a user interface (not shown). This future flow characteristic may be developed by running the simulation system 250 over a period of time to estimate future values of output variables over a specific future time horizon. Likewise, as illustrated in FIG. 9, the reactor simulation block 256 may provide a plot or a trend chart 296 for the simulated output temperature based on the process models or other algorithms used therein. Of course, the computation of future process variable estimates may be computed using, for example, techniques similar to that used in MPC control to make future predictions. Some of these techniques are disclosed in more detail in U.S. Pat. No. 7,050,083. If desired, graphical elements or graphical interface elements may be provided by the simulation blocks 252, 254 and 256 to allow these future values to be accessed and viewed by other applications, by user interfaces within the process plant or by other interested devices.

Moreover, as will be understood, the future predicted values or future simulated values of one or more a process variables or other simulation outputs may be used to perform process model correction or updating within the simulation blocks of FIG. 9 in addition to, in conjunction with or instead of using a current predicted process variable value and a currently measured process variable value fed back to a simulation block. In this case, the future values calculated for a particular process variable or other process element may be computed and stored, and the actual value of the process variables may then be measured at the times corresponding to each of the computed future values. The difference(s) between the actual measured process element values at a particular time and the predicted future value at that particular time may then be used to regenerate the process model that is used in the simulation routine develop the future values. The use of future values to regenerate process models is especially applicable when the process models are step response models or impulse response models, such as finite impulse response models.

Thus, as described with respect to FIG. 9, actual process measurements may be used in simulation blocks to allow automatic correction of the process models used in the simulation block based on a comparison of a calculated value and a measured value for the same process element. Moreover, when process measurements are not available or have become unavailable, for example, due to a failure of measurement capabilities, then manual entry of the value may be used to correct the process model based on a comparison between the entered value and the calculated value. Still further, when the process simulation is based on a step or finite impulse response or other techniques, such as neural network, first principal models, or other commonly used techniques, the process models may be automatically corrected based on the difference between the calculated and measured value(s). More specifically, techniques that have previously been utilized in MPC may be used to correct the process model(s) including for example, bias correction in which a correction factor is calculated and applied to a process model (or to an output of a process model) based on the difference between the actual measured value and the simulated value of a process parameter to thereby eliminate a bias between the process model and the actual process plant. Of course other correction methods may be used as well, with a number of such correction techniques being described in U.S. Patent Application Publication No. 2004/0249483 A1, entitled "Multiple-Input/Multiple-Output Control Blocks with Non-Linear Predictive Capabilities," which published on Dec. 9, 2004 (and specifically the description with respect to FIG. 4 of this publication) and U.S. patent application Ser. No. 11/240,705, entitled "On-Line Adaptive Model Predictive Control in a Process Control System," which was filed on Sep. 30, 2005 (and specifically the description of FIGS. 2-4 thereof which describe a method of altering process models within an adaptive MPC control routine), the entire disclosures of which are hereby incorporated by reference herein.

Also, when the process simulation is based on a step or finite impulse response, or other techniques, such as neural network, first principal models, and other commonly used techniques, then the future output values can be calculated and saved for display. Again, for models based on step and finite impulse response, the techniques that have previously been utilized in MPC may be used to calculate the future values. Additionally, a process simulation environment may support viewing elements/applications that allow both the current and the future simulation output values to be displayed. For example, a user interface window may be provided to trend future output values using any desired viewing technique, such as trend graphs, bar graphs, numerical charts and graphs, etc.

If desired, the process modules described herein may provide and simulate redundancy functions within a process control network or a process plant. In particular, the process modules may simulate the operation of actual redundant elements, such as redundant devices, redundant control blocks, etc. disposed within the process plant and be able to detect or simulate the operation of actual redundant elements (including, for example, when the back-up redundant element should take over, etc.) Additionally, if desired, a process module with its simulation capabilities may be used as one of a redundant pair of elements within a process plant. In this case, the process module (or any portion thereof) may operate as a back-up device providing back-up or redundant data (signals, calculations, etc.) in case of a failure of or a detected problem associated with the primary (and actual physical) device. In this case, the process module acting as the redundant element may be communicatively interconnected with the control modules (that perform control or sensing operations) in any known manner to provide the redundant capabilities. This use of process modules as redundant elements within the process plant is particularly useful when the process modules are connected to one or more high fidelity simulation packages in the manner described above.

It will be understood that the functionality of the smart process objects, the graphic display elements and the process modules described herein may operate in the operator workstation 20 and does not need to be downloaded to and configured within the controllers, field devices, etc. within the plant 10, which makes this functionality easier to implement, view, change, etc. Further, this functionality enables system level determinations to be made more easily than within the process devices, controllers, etc. because the information pertaining to the devices on a system level is all typically available to the operator workstation 20 in general and to the execution engine 48 in particular whereas all of this information is not typically made available to each controller and field device within the process plant 10. However, when it is advantageous to do so, some of the logic associated with the process modules, such as primitives, may be embedded in the devices, equipment and controllers down within the process plant. The use of smart process objects to create integrated process control modules and graphic displays enables the execution engine 48 to, for example, automatically detect leaks and produce smart alarms with minimal amounts of user configuration activities, to calculate and track flow and mass balances within the plant 10, to track losses within the plant 10 and to provide higher level diagnostics for the plant 10 and to simulate the operation of the plant during engineering design and operator training.

Figure 10:
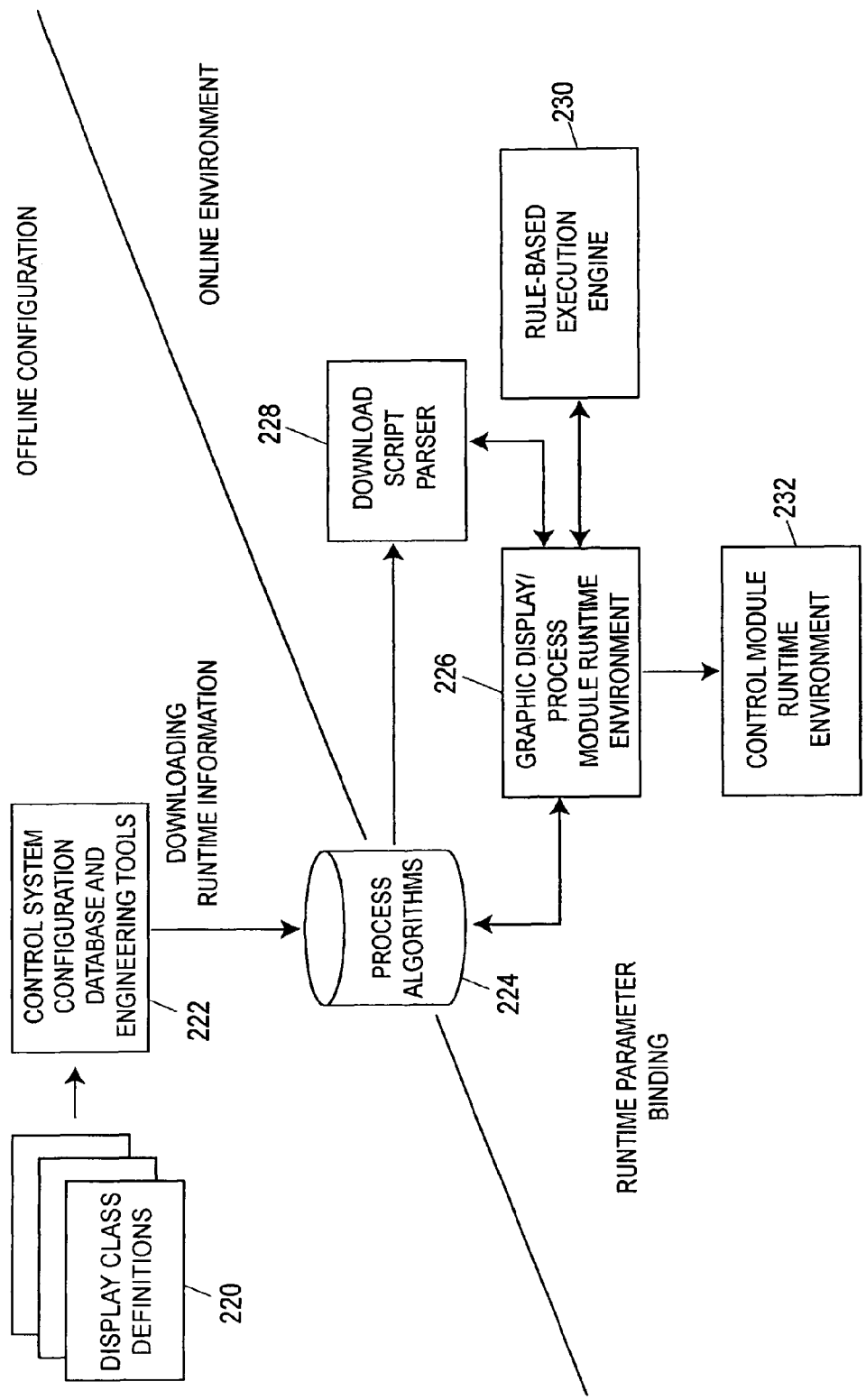
FIG. 10 is a logical block diagram illustrating a manner in which process modules and simulation systems using smart process objects may be created in and implemented within an existing process control network.

FIG. 10 depicts one possible manner of integrating the execution engine 48 and the process modules and graphic displays used thereby within a process plant having a distributed control strategy. As illustrated in FIG. 10, the display class definitions 220 created by or associated with the process modules providing displays to an operator during execution by the execution engine 48 and are provided to the control configuration database and engineering tools 222 which may use and organize these display class definitions in any desired manner within the control strategy documentation. Process algorithms 224 may be connected to these display class definitions prior to runtime and then the display class definitions and flow algorithms bound thereto may be instantiated and provided to the graphic display/process module runtime environment 226 (which may be implemented in the form of one or more execution engines 48 in one or more workstations). The graphic display/process module runtime environment 126 uses a download script parser 228 to parse the code during execution (i.e., to perform just in time object code conversion) and uses a ruled-based execution engine 230 to execute flow algorithms or other rule based procedures provided for or bound to the display classes. During this process, the graphic display/process module runtime environment 226 may communicate with the control module runtime environment 232, which may be executed in controllers and field devices associated with the process, to provide data or information to the control module runtime environment 232 or to access data or other information from the control module runtime environment 232. Of course, the graphic display/process module runtime environment 226 may communicate with the control module runtime environment 232 using any desired or preconfigured communication networks, such as the Ethernet bus 24 of FIG. 1. Still further, other methods of integrating the graphic displays, process modules and control modules described herein into a standard process control system or process plant may be used as well.

When implemented, any of the software described herein may be stored in any computer readable memory such as on a magnetic disk, a laser disk, or other storage medium, in a RAM or ROM of a computer or processor, etc. Likewise, this software may be delivered to a user, a process plant or an operator workstation using any known or desired delivery method including, for example, on a computer readable disk or other transportable computer storage mechanism or over a communication channel such as a telephone line, the Internet, the World Wide Web, any other local area network or wide area network, etc. (which delivery is viewed as being the same as or interchangeable with providing such software via a transportable storage medium). Furthermore, this software may be provided directly without modulation or encryption or may be modulated and/or encrypted using any suitable modulation carrier wave and/or encryption technique before being transmitted over a communication channel.

While the present invention has been described with reference to specific examples, which are intended to be illustrative only and not to be limiting of the invention, it will be apparent to those of ordinary skill in the art that changes, additions or deletions may be made to the disclosed embodiments without departing from the spirit and scope of the invention.

What is claimed is:

1. A simulation system for use in simulating the operation of a portion of an operating process plant communicatively coupled to the simulation system, the operating process plant including one or more process controllers communicatively coupled to one or more field devices processing physical materials to produce a product, the simulation system stored as instructions on a non-transitory computer-readable medium, the simulation system comprising:
    one or more simulation blocks configured to perform simulation of one or more pieces of equipment within the operating process plant, each simulation block including:
        a process model that models a portion of the operating process plant; and
        a simulation unit that uses the process model to simulate the operation of the portion of the operating process plant to produce a simulated output for an on-line process element associated with the portion of the operating process plant, the simulated output including one or more predicted future values for the on-line process element; and
    a control module communicatively coupled to the one or more simulation blocks and configured to control an online activity of the operating process plant using an actual value of the on-line process element;
    wherein at least one of the simulation blocks includes an input from the operating process plant configured to accept an indication, transmitted from the operating process plant, of the actual value of the on-line process element measured in a control loop of the operating process plant and corresponding to the simulated output for the on-line process element,
    wherein the actual value of the on-line process element and the simulated output for the on-line process element are compared to calculate a compensation factor to be applied to an output of the process model to produce a modified simulated output reflecting a non-modeled change in the operating process plant and
    wherein the control module is configured to automatically replace the actual value with the simulated output for the on-line process element when the actual value is known to be faulty or has a bad status, the simulated output being generated by the simulation system.

2. The simulation system of claim 1, wherein the on-line process element is a process variable.

3. The simulation system of claim 2, wherein the process variable is indicative of one a fluid flow, a temperature or a pressure within the operating process plant.

4. The simulation system of claim 1, wherein at least one of the simulation blocks includes a model correction unit that compares the indication of the actual value of the on-line process element with the simulated output of the on-line process element to develop an updated process model for use by the simulation unit.

5. The simulation system of claim 1, wherein the input accepts a measurement of the on-line process element made during on-line operation of the operating process plant.

6. The simulation system of claim 1, wherein the input accepts a user provided indication of the value of the on-line process element.

7. The simulation system of claim 4, wherein a model correction unit uses one or more of the predicted future values for the on-line process element to develop the updated process model for use by the simulation unit.

8. The simulation system of claim 1, wherein the process model of one of the simulation blocks is a first principles model.

9. The simulation system of claim 1, wherein the process model of one of the simulation blocks is an impulse response model.

10. The simulation system of claim 1, wherein the process model of one of the simulation blocks is a step response model.

11. The simulation system of claim 1, wherein the process model of one of the simulation blocks is a neural network model.

12. The simulation system of claim 1, wherein the simulated output further includes a current valve indicating a predicted current value for the on-line process element.

13. A system for use in simulating the operation of a portion of an operating process plant, the operating process plant including one or more process controllers communicatively coupled to one or more field devices processing physical materials to produce a product, the system comprising:
    a simulation system communicatively coupled to the operating process plant and including a plurality of simulation blocks and one or more communication links that communicatively couple the simulation blocks together, the simulation system configured to perform simulation of one or more pieces of equipment within the operating process plant, wherein each of the simulation blocks includes:
        a process model that models a portion of the operating process plant;
        a simulation routine that uses the process model to simulate the operation of the portion of the operating process plant to produce a simulated output for an on-line process element, the simulated output including one or more future values for the on-line process element; and
    a process control system having one or more control blocks connected to equipment within the process to perform on-line control of the process,
    a control module communicatively coupled to the plurality of simulation blocks and configured to control an online activity of the operating process plant using an actual value of the on-line process element;
    wherein one of the simulation blocks includes an input configured to accept an indication of an actual value of the on-line process element measured in a control loop of the operating process plant and corresponding to the simulated output for the on-line process element,
    wherein the actual value of the on-line process element and the simulated output for the on-line process element are compared to calculate a compensation factor to be applied to an output of the process model to produce a modified simulated output reflecting a non-modeled change in the operating process plant and wherein the control module is configured to automatically replace the actual value with the simulated output for the on-line process element when the actual value is known to be faulty or has a bad status, the simulated output being generated by the system.

14. The system of claim 13, wherein each of the simulation blocks includes an output communicatively coupled to a user interface for providing the one or more future values for the on-line process element to a user display.

15. The system of claim 13, wherein the one of the simulation blocks includes a model correction routine that compares the indication of the actual value of the on-line process element with the simulated output of the on-line process element to develop an updated process model for use by the simulation routine.

16. The system of claim 15, wherein the input of one of the simulation blocks is communicatively connected to an output of the process control system to accept an on-line measured process value as the indication of the actual value of the on-line process element.

17. The system of claim 13, wherein one of the simulation blocks includes an output communicatively coupled to one of control blocks for providing the one or more future values for the on-line process element to the one of the control blocks for use performing a control activity.

18. The system of claim 17, wherein the control activity is a process optimization activity.

19. The system of claim 17, wherein the control activity is an equipment control activity.

20. The system of claim 13, wherein the process model for one of the simulation blocks is a first principles model.

21. The system of claim 13, wherein the process model for one of the simulation blocks is an impulse response model or a step response model.

22. The system of claim 13, wherein multiple ones of the simulation blocks simulate the operation of process equipment within the operating process plant and wherein one of the one or more communication links models the movement of a process material from a first piece of process equipment to a second piece of process equipment within the operating process plant.

23. A method of simulating the operation of a portion of an operating process plant, the operating process plant including one or more process controllers communicatively coupled to one or more field devices processing physical materials to produce a product, the method comprising:
- simulating the operation of the portion of the operating process plant in a simulation block operating on a first computer device communicatively coupled to the operating process plant using a process model for the portion of the operating process plant to produce a simulated output for an on-line process element associated with the portion of the operating process plant, the simulated output including a series of future values for the on-line process element;
- providing to the process model data from the operating process plant;
- providing the series of future values for the on-line process element to a second device associated with the operating process plant;
- receiving at the simulation block an indication, transmitted from the operating process plant, of an actual output value of the on-line process element, the actual output value measured in a control loop of the operating process plant and corresponding to the simulated output for the on-line process element;
- comparing the actual output value of the on-line process element and the simulated output for the on-line process element to calculate a compensation factor to be applied to an output of the process model to produce a modified simulated output reflecting a non-modeled change in the operating process plant and
- automatically replacing the actual value with the simulated output for the on-line process element when the actual output value is known to be faulty or has a bad status.

24. The method of claim 23, wherein providing the series of future values for the on-line process element to the second device includes providing the series of future values to a user interface device for display to a user.

25. The method of claim 24, further including creating a graph illustrating the series of future values on the user interface device.

26. The method of claim 23, wherein providing the series of future values for the on-line process element to the second device includes providing the series of future values to a control device for use in controlling the operating process plant.

27. The method of claim 23, further including using the indication of an actual value of the on-line process element corresponding to the simulated output for the on-line process element to develop an updated process model for use while simulating the portion of the operating process plant.

28. The method of claim 27, including running a process control system to control the operation of the portion of the operating process plant in conjunction with simulating the operation of the portion of the operating process plant, measuring the on-line process element within the operating process plant and using the measured value of the on-line process element as the indication of the actual value of the on-line process element.

29. The method of claim 23, wherein simulating the operation of the portion of the operating process plant using a process model includes using a first principles model as the process model.

30. The method of claim 23, wherein simulating the operation of the portion of the operating process plant using a process model includes using an impulse response model or a step response model as the process model.

31. A method of simulating the operation of an on-line process plant, the on-line process plant including one or more process controllers communicatively coupled to one or more field devices processing physical materials to produce a product, the method comprising:
- storing a plurality of simulation objects in a computer readable memory, wherein each of the plurality of simulation objects is associated with a different physical entity within the on-line process plant, each of the simulation objects including:
  - a process model that models a portion of the on-line process plant; and
  - a simulation routine that uses the process model to simulate the operation of the portion of the on-line process plant to produce a simulated output for an on-line process element, the simulated output including multiple future values for the on-line process element;
- enabling a user to communicatively connect the simulation objects together to develop a simulation system;
- executing the simulation system on one or more processors to produce a simulated output for one or more on-line process elements during on-line operation of the on-line process plant including producing multiple future values for each of the one or more on-line process elements during a particular execution of the simulation system;

providing to the process model of one of the simulation objects data from the on-line process plant;

providing the multiple future values for one of the one or more on-line process elements from the simulation system to a further device;

receiving at the one of the simulation objects an indication, transmitted from the on-line process plant, of a value of each of the one or more on-line process elements, measured in a control loop of the on-line process plant and corresponding to the multiple future values;

comparing the values of each of the one or more on-line process elements and the simulated outputs for the one or more on-line process elements to calculate a compensation factor to be applied to an output of the process model to produce a modified simulated output reflecting a non-modeled change in the on-line process plant and automatically replacing an actual value for the one or more on-line process elements during on-line operation of the on-line process plant with the simulated output for the one or more on-line process elements during on-line operation of the on-line process plant when the actual value is known to be faulty or has a bad status.

32. The method of claim 31, wherein providing the multiple future values from the simulation system to a further device includes providing the multiple future values to a user interface device for display to a user.

33. The method of claim 31, wherein providing the multiple future values from the simulation system to a further device includes providing the multiple future values to a controller device for use in performing a control activity.

34. The method of claim 31, wherein providing the multiple future values from the simulation system to a further device includes providing the multiple future values to an optimizer for use in performing a process or control optimization technique.

35. The method of claim 31, further including regenerating the process model of one of the simulation objects during on-line operation of the on-line process plant using a comparison between the indication of an actual value of the on-line process element and the simulated output for the on-line process element.

36. The method of claim 35, wherein regenerating the process model includes enabling a user to provide the indication of an actual value of the on-line process element to be used in the comparison between the indication of the actual value of the on-line process element and the simulated output of the on-line process element.

37. The method of claim 35, wherein regenerating the process model includes providing a measurement signal indicative of a measurement of the actual value of the on-line process element measured during the on-line operation of the on-line process plant as the indication of the actual value of the on-line process element.

38. The method of claim 35, wherein the process model for one of the simulation objects is an impulse response model or a step response model and wherein regenerating the process model for the one of the simulation objects during on-line operation of the on-line process plant includes performing bias correction based on a difference between the indication of the value of the on-line process element and the simulated output for the on-line process element.

* * * * *